United States Patent
Xu et al.

(10) Patent No.: US 6,217,721 B1
(45) Date of Patent: *Apr. 17, 2001

(54) FILLING NARROW APERTURES AND FORMING INTERCONNECTS WITH A METAL UTILIZING A CRYSTALLOGRAPHICALLY ORIENTED LINER LAYER

(75) Inventors: Zheng Xu, Foster City; John Forster, San Francisco; Tse-Yong Yao, Sunnyvale; Jaim Nulman, Palo Alto; Fusen Chen, Cupertino, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/628,835

(22) Filed: Apr. 5, 1996

Related U.S. Application Data

(63) Continuation-in-part of application No. 08/511,825, filed on Aug. 7, 1995, now Pat. No. 5,962,923.

(51) Int. Cl.$^7$ .................................................. C23C 14/34
(52) U.S. Cl. .............................. 204/192.17; 204/192.15; 438/643; 438/648; 438/653; 438/656; 438/660; 438/661; 438/685; 438/687; 438/688
(58) Field of Search ................... 204/192.15, 192.17; 438/643, 653, 656, 685, 688, 660, 661, 648, 687

(56) References Cited

U.S. PATENT DOCUMENTS

| | | | |
|---|---|---|---|
| 3,437,864 | 4/1969 | Kofoid et al. | 313/231 |
| 3,616,452 | 10/1971 | Bessot et al. | 204/298 |

(List continued on next page.)

FOREIGN PATENT DOCUMENTS

| | | | |
|---|---|---|---|
| 2110668 | 9/1971 | (DE) | 23/15 |
| 275021 A2 | 7/1988 | (EP) . | |

(List continued on next page.)

OTHER PUBLICATIONS

Pramanik et al., "Barrier Metals for ULSI: Deposition and Manufacutring", Solid State Technology, pp. 73–82, Jan. 1993.*

(List continued on next page.)

Primary Examiner—Rodney McDonald
(74) Attorney, Agent, or Firm—Charles S. Guenzer, Esq.

(57) ABSTRACT

An aluminum sputtering process, particularly useful for filling vias and contacts of high aspect ratios formed through a dielectric layer and also usefull for forming interconnects that are highly resistant to electromigration. A liner or barrier layer is first deposited by a high-density plasma (HDP) physical vapor deposition (PVD, also called sputtering) process, such as is done with an inductively coupled plasma. If a contact is connected at its bottom to a silicon element, the first sublayer of the liner layer is a Ti layer, which is silicided to the silicon substrate. The second sublayer comprises TiN, which not only acts as a barrier against the migration of undesirable components into the underlying silicon but also when deposited with an HDP process and biased wafer forms a dense, smooth crystal structure. The third sublayer comprises Ti and preferably is graded from TiN to Ti. Over the liner layer, an aluminum layer is deposited in a standard, non-HDP process. The liner layer allows the hottest part of the aluminum deposition to be performed at a relatively low temperature between 320 and 500° C., preferably between 350 and 420° C., while still filling narrow plug holes, and the TiN does not need to be annealed to form an effective barrier against diffusion into the silicon. A horizontal interconnect formed by the inventive process is resistant to electromigration.

59 Claims, 11 Drawing Sheets

U.S. PATENT DOCUMENTS

| | | | |
|---|---|---|---|
| 3,619,403 | 11/1971 | Gorin | 204/312 |
| 3,649,502 | 3/1972 | Herte et al. | 204/192 |
| 3,699,034 | 10/1972 | Lins et al. | 204/192 |
| 3,705,091 | 12/1972 | Jacob | 204/312 |
| 3,873,884 | 3/1975 | Gabriel | 315/267 |
| 3,875,068 | 4/1975 | Mitzel | 250/531 |
| 3,879,597 | 4/1975 | Bersin et al. | 219/121 |
| 4,123,316 | 10/1978 | Tsuchimoto | 156/643 |
| 4,233,109 | 11/1980 | Nishizawa | 156/643 |
| 4,351,712 | 9/1982 | Cuomo et al. | 204/192 |
| 4,362,632 | 12/1982 | Jacob | 422/183.04 |
| 4,368,092 | 1/1983 | Steinberg et al. | 156/345 |
| 4,421,592 | 12/1983 | Shuskus et al. | 156/613 |
| 4,431,898 | 2/1984 | Reinberg et al. | 219/121 |
| 4,431,901 | 2/1984 | Hull | 219/121 |
| 4,663,009 | 5/1987 | Bloomquist et al. | 204/192.2 |
| 4,668,338 | 5/1987 | Mayadan et al. | 156/643 |
| 4,668,365 | 5/1987 | Foster et al. | 204/192.23 |
| 4,686,113 | 8/1987 | Delfino et al. | 427/45.1 |
| 4,716,491 | 12/1987 | Ohno et al. | 361/230 |
| 4,810,935 | 3/1989 | Boswell | 315/111.41 |
| 4,844,775 | 7/1989 | Keeble | 156/643 |
| 4,849,675 | 7/1989 | Muller | 315/111.51 |
| 4,859,908 | 8/1989 | Yoshida et al. | 315/111.81 |
| 4,911,814 | 3/1990 | Matsuoka et al. | 204/298 |
| 4,918,031 | 4/1990 | Flamm et al. | 437/225 |
| 4,948,458 | 8/1990 | Ogle | 156/643 |
| 4,951,601 | 8/1990 | Maydan et al. | 118/719 |
| 4,976,839 * | 12/1990 | Inoue | 204/192.17 |
| 4,990,229 | 2/1991 | Campbell et al. | 204/298.06 |
| 4,999,096 * | 3/1991 | Nihei et al. | 204/192.3 |
| 5,018,479 | 5/1991 | Markunas et al. | 118/723 |
| 5,108,570 * | 4/1992 | Wang | 204/192.3 |
| 5,146,137 | 9/1992 | Geshe et al. | 315/111.21 |
| 5,171,412 | 12/1992 | Talieh et al. | 204/192.15 |
| 5,178,739 * | 1/1993 | Barnes et al. | 204/192.12 |
| 5,186,718 | 2/1993 | Tepman et al. | 29/25.01 |
| 5,225,740 | 7/1993 | Ohkawa | 315/111.41 |
| 5,231,334 | 7/1993 | Paranjpe | 315/111.21 |
| 5,240,880 * | 8/1993 | Hindman et al. | 204/192.17 |
| 5,290,731 | 3/1994 | Sugano et al. | 437/174 |
| 5,338,423 | 8/1994 | Hindman et al. | 204/192.12 |
| 5,354,443 | 10/1994 | Moslehi | 204/192.12 |
| 5,358,616 | 10/1994 | Ward | 204/192.15 |
| 5,371,042 | 12/1994 | Ong | 437/194 |
| 5,378,660 | 1/1995 | Ngan et al. | 437/247 |
| 5,391,517 * | 2/1995 | Gelatos et al. | 438/687 |
| 5,397,962 | 3/1995 | Moslehi | 315/111.51 |
| 5,430,355 | 7/1995 | Paranjpe | 315/111.21 |
| 5,435,881 | 7/1995 | Ogle | 156/345 |
| 5,443,995 * | 8/1995 | Nulman | 204/192.17 |
| 5,658,828 * | 8/1997 | Lin et al. | 438/643 |

FOREIGN PATENT DOCUMENTS

| | | | |
|---|---|---|---|
| 0146446 | 11/1989 | (EP) | H01L/21/306 |
| 0421430 | 10/1991 | (EP) | H01J/37/32 |
| 0489407 | 6/1992 | (EP) | H01J/37/32 |
| 525637 A1 | 2/1993 | (EP) . | |
| 655780 A1 | 5/1995 | (EP) . | |
| 758148 A2 | 2/1997 | (EP) . | |
| 1399603 | 7/1975 | (GB) | H01J/27/00 |
| 2069230 | 8/1981 | (GB) | H01J/27/18 |
| 2231197 | 7/1990 | (GB) | H01J/37/32 |
| 53-84684 | 7/1978 | (JP) | H01L/21/032 |
| 58-63139 | 4/1983 | (JP) | C23C/15/00 |
| 61-64124 | 4/1986 | (JP) | H01L/21/205 |
| 63-317675 | 12/1988 | (JP) | C23C/16/50 |
| 4-027163 | 1/1992 | (JP) . | |
| 6-168891 | 6/1994 | (JP) . | |
| 10-237639 | 9/1998 | (JP) . | |
| WO86/06923 | 11/1986 | (WO) | H05H/1/46 |
| 92/07969 | 5/1992 | (WO) . | |

OTHER PUBLICATIONS

Rossnagel et al., "Metal ion deposition from ionized mangetron sputtering discharge", J. Vac. Sci. Technol. B 12(1), pp. 449–453, Feb. 1994.*

Pramanik et al., "Barrier Metals for ULSI: Deposition and Manufacturing", Solid State Technology, pp. 73–76, 78, 79 82, Jan. 1993.*

Dixit et al., "Reactively sputtered titanium nitride films for submicron contact barrier metallization," *Applied Physics Letters*, vol. 62, No. 25, pp. 357–359, 1993.

EP Search Report for 96305722.9 dated Jul. 7, 1999.

EP Search Report for 96305733.6–2111 dated Oct. 4, 1999.

Rossnagel et al., "Metal ion deposition from ionized mangetron sputtering discharge," *Journal of Vacuum Science and Technology B*, vol. 12, No. 1, 1994, pp. 449–453.

Mei et al., "Nonconformal Al via filling and planarization by partially ionized beam deposition for multilevel interconnection," *IEEE Electron Device Letters*, vol. EDL–8, No. 10, 1987, pp. 505–505.

Macalpine et al., *Coaxial Resonators with Helical Inner Conductor*, Dec. 1959 Issue of Proceedings of the IRE, pp. 2099–2105.

Aston et al., *Ion Beam Divergence Characteristics of Two–Grid Accelerator Systems,* May 1978 AIAA Journal vol. 16, #5, pp. 516–524.

Sakudo et al., *Microwave Ion Source,* Jul. 1977 Review of Scientific Instruments, vol. 48, #7, pp. 762–766.

Matsuzawa et al., *Direct Anodization of GaAs and Si at Extremely Low Substrate Temperature by Low Pressure Oxygen Plasma,* Jul./Aug. 1980 Journal of Vacuum Science & Technology, pp. 793–795.

Takuo Sugano, Ed., *Applications of Plasma Processes to VLSI Technology,* 1982–1985.

Boswell et al., *Some Features of RF Excited Fully Ionized Low Pressure Argon Plasma,* Sep. 6, 1982, Phyusics Letters, vol. 91A, #4, pp. 163–166.

Rossnagel, *Directional And Ionized Sputter Deposition For Microelectronics Applications,* 1995 Proceedings of the 3rd ISSP, pp. 253–260.

Rossnagel, *Filling Dual Damascene Interconnect Structures With AlCu and Cu Using Ionized Magnetron Deposition,* Jan./Feb. 1995 Journal of Vacuum Science & Technology B, vol. 13, #1, pp. 125–129.

Kikuta, "Aluminum Reflow Sputtering," *Mrs Bulletin*, Nov. 1995, vol. 20, No. 11, pp. 53–56.

Pramanik, "Aluminum–Based Metallurgy for Global Interconnects," *Mrs Bulletin*, Nov. 1995, vol. 20, No. 11, pp. 57–60.

Pramanik et al., "Barrier Metals for ULSI: Deposition and Manufacturing," *Solid State Technology*, Jan. 1993, pp. 73–76, 78, 79, 82.

Kim, et al., "The effect of reactive–sputtered TiN on electromigration of Al alloy metallization," *Proceedings IEEE VMIC Conference*, Jun. 27–29, 1995 (104/95/0443), p. 443.

Campbell et al., "Relationship between Texture and Electromigration Lifetime in Sputtered Al–1% Si thin Films," *Journal of Electronic Materials*, vol. 22, 1993, pp. 589–596.

Kordič et al., "Correlation between stress voiding of Al(Si)(Cu) metallization and crystal orientation of aluminum grains," *Journal of Applied Physics*, vol. 74, 1993, pp. 5391–5394.

Hopwood et al., "Langmuir probe measurements of a radio frequency induction plasma," *Journal of Vacuum Science and Technology A*, vol. 11, 1993, pp. 152–156.

Knorr et al., "The role of texture in the electromigration behavior in pure aluminum films," *Journal of Applied Physics*, vol. 79, 1996, pp. 2409–2417.

* cited by examiner

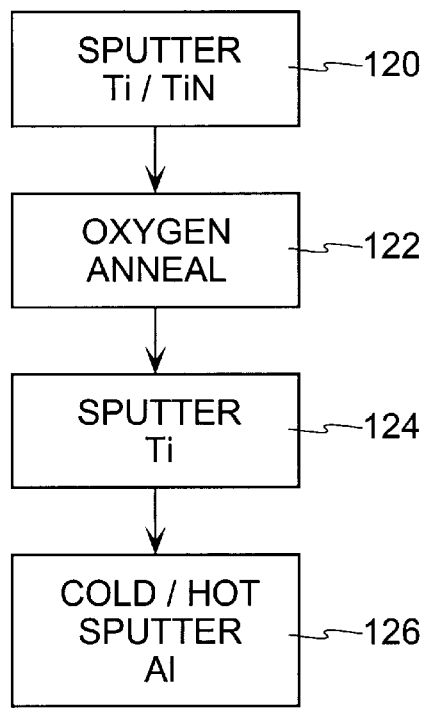
FIG. 5
(PRIOR ART)
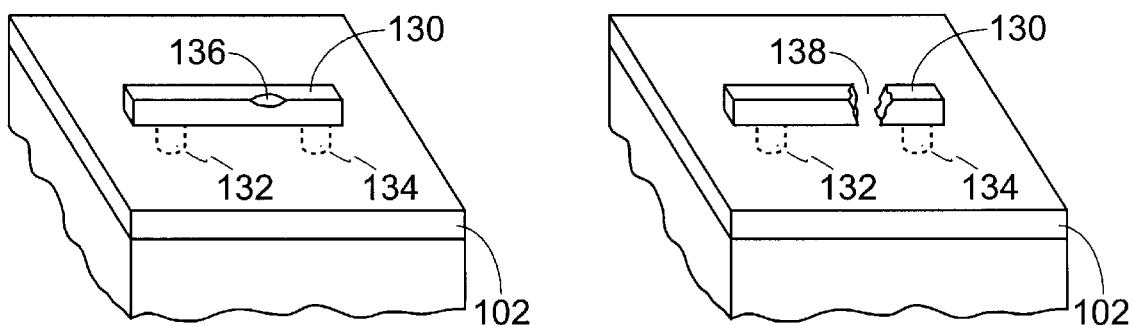
FIG. 6
(PRIOR ART)
FIG. 7
(PRIOR ART)

FILLING NARROW APERTURES AND FORMING INTERCONNECTS WITH A METAL UTILIZING A CRYSTALLOGRAPHICALLY ORIENTED LINER LAYER

RELATED APPLICATION

This application is a continuation in part of Ser. No. 08/511,825, filed Aug. 7, 1995 now U.S. Pat. No. 5,962,923.

FIELD OF THE INVENTION

The invention generally relates to the fabrication of semiconductor devices. In particular, the invention relates to filling metal into contacts, vias, or other apertures through insulating layers in a semiconductor integrated circuit and to depositing metal lines interconnecting such contacts and vias.

BACKGROUND OF THE INVENTION

Advanced integrated circuits (ICs) increasingly require more vertical interconnects extending through apertures etched in intervening dielectric layers. The shrinking lateral dimensions of the ICs require that those vertical interconnects have large aspect ratios, that is, the interconnect feature be narrow and deep. These contacts and vias also need to be wired together by horizontally interconnecting wire lines to achieve the required complex electrical paths. The typical fabrication process involves depositing a dielectric layer over a semiconductive or patterned metallic horizontal interconnect layer, photolithographically defining that dielectric layer to have plug holes or other structures extending from its top to its bottom overlying the semiconductive or horizontal interconnect layer, and then depositing a conductive material into the plug holes and possibly above the dielectric layer to simultaneously deposit the material for the horizontal interconnects above that dielectric layer.

The usual integrated circuit, whether it be a memory, logic, or other device, involves a semiconducting silicon substrate into which are formed various regions of different conductivity doping types or doping levels, and these conductivity types and doping levels need to be tightly controlled. As explained previously, one or more dielectric layers are deposited over the silicon, and holes are etched through the respective layers and thereafter filled to form vertical interconnects to the underlying layer, whether it be the silicon or a wiring pattern formed on top of a previously deposited dielectric layer. An upper metal wiring layer is typically deposited simultaneously with the vertical interconnect beneath it. If the vertical interconnect connects at its bottom to silicon, it is referred to as a contact since it contacts silicon, and a proper and stable ohmic contact must be formed between the metal and silicon to avoid undue contact resistance. If the interconnect connects at its bottom to a metal in a multi-level metallization structure, it is referred to as a via. Either a contact or a via can be referred to as a plug or a vertical interconnect, but, unless the interconnect is specified to be otherwise, it will be assumed to be a horizontal interconnect. Vias and contacts are typically circular or nearly square so as to minimize their surface area. However, other holes are sometimes formed in the shape of trenches having one narrow dimension and one long dimension, and these trenches then need to be filled with metal.

A severe problem arises when the hole to be filled has a large aspect ratio. The aspect ratio is the ratio of the depth to the width of a plug formed in a dielectric layer or other type of layer. For a trench, the width that determines the aspect ratio is the smallest lateral dimension. As the density of elements on an integrated circuit has increased, the width of contacts, vias, trenches, and other apertures has decreased while their depth has not substantially decreased because a minimum dielectric thickness is required to electrically isolate stacked layers in the integrated circuit. Hence, the aspect ratio has been increasing. Older technology has generally been limited to filling contacts, vias, and trenches having aspect ratios of 0.5:1 or less. Modern technology uses aspect ratios of up to about 2:1. Advanced technology must adapt to aspect ratios of 5:1 or greater.

If, as is usual, the bulk of the conductive material filled into the plug or trench is a metal, and if further that metal is reactive with the underlying layer or may deleteriously interdiffuse with it, such as occurs with a contact of a metal to silicon, a diffusion barrier layer needs to be coated into the aperture before the metal is deposited therein, and then a thicker bulk metal is filled in over the barrier layer. Titanium nitride (TiN) is presently most commonly used for the barrier layer since it is moderately conductive and, with some added processing, is compatible with both silicon and aluminum.

The hole filling process almost necessarily deposits a metallic layer of laterally varying thickness over the dielectric layer and above the hole. As a result, it is usually necessary to planarize the metallic layer as part of the hole filling process so that subsequent processes can be effected on relatively planar surfaces. A planar surface is particularly required for photolithography, for which an undulatory substrate can defocus the projected pattern. A planar surface is also preferred to underlie thin interconnect lines, which tend to separate in surmounting large vertical steps.

Physical vapor deposition (PVD) is a well known method in the fabrication of integrated circuits both for filling apertures with metals and for depositing planar metal for horizontal interconnects. An example of a modern PVD system is the Endura® PVD System, available from Applied Materials, Inc. of Santa Clara, Calif. In a standard PVD process, a metal target of the metallic composition desired to be deposited is placed within a plasma reaction chamber in relatively close opposition to the wafer on which the metal is to be deposited. Argon at reduced pressure is filled into the space between the target and the wafer. The metallic target is DC biased sufficiently negatively to the wafer to cause the argon gas to discharge and form an argon plasma. The resultant positive argon ions in the plasma are strongly attracted to the negatively biased target and impact the target at such high energies that atoms or atomic clusters of the target material are dislodged and ejected from the target, that is, sputtered from the target. At least some of the sputtered atoms are deposited on the wafer in a substantially ballistic process. Examples of sputtered metals are aluminum and titanium.

PVD can also be used to sputter deposit compounds such as TiN in a process called reactive sputtering in which the titanium is sputtered from an substantially pure titanium target and reacts with nitrogen gas (or plasma) filling the space intervening between the target and the wafer. The titanium atoms at these relatively low pressures typically undergo a surface reaction with nitrogen after being deposited on the wafer such that the wafer is sputter deposited with TiN. This process is described by Pramanik et al. in "Barrier Metals for ULSI: Deposition and Manufacturing," *Solid State Technology*, January, 1993, pp. 73–76, 78, 79, 82.

Returning specifically to the sputter deposition of aluminum into plug apertures, FIG. 1 illustrates a substrate 100, here assumed to have a surface portion of either crystalline silicon or polysilicon. The substrate 100 is overlaid with a dielectric layer 102 to form a field oxide or interlayer dielectric. In modern silicon processing, the dielectric layer 102 is usually formed by either thermal growth or plasma-enhanced chemical vapor deposition (PECVD), typically of $SiO_2$, although other insulators, such as silicate glasses or even organic dielectrics, can be used.

A contact hole 104 is photolithographically defined and then etched through the dielectric layer 102 to extend down to the silicon substrate 100 in order to provide electrical access through the dielectric layer 102 for a patterned upper metal-interconnect level to be formed over the dielectric layer 102 and to contact a specific defined portion of the silicon substrate, such as a source or drain in a MOS transistor. Alternatively, the substrate 100 could be a lower metal-interconnect level, and the hole 104, now called a via hole, is positioned to overlie a metal line formed over the dielectric layer 110 of the lower metal level so as to electrically contact it to another metal line in the upper metal level. Yet further alternatively, a trench aperture can be formed through the dielectric layer 102 and extend a over a relatively large length in the plane out of the illustration but have a relatively narrow width as illustrated, resulting in a high aspect ratio.

FIG. 2 illustrates the result of a standard low-temperature aluminum sputter into a contact hole 104 with a relatively high aspect ratio. A PVD process forms a planar aluminum layer 106 over the level portions of the dielectric layer 102. However, standard PVD produces a substantially isotropic ballistic pattern of aluminum atoms, and in a low-temperature process the sputtered aluminum atoms stick relatively close to where they strike the wafer. As a result, the aluminum layer 106 forms overhangs 108 near the upper corners 110 of the contact hole 104. Once they have formed, the overhangs 108 shield the bottom wall 112 of the contact hole 104 and prevent a substantial direct sputter deposition to fill the hole. The lower portions of the side walls 114 of the contact hole 104 are not favorably oriented for deposition from the isotropic pattern.

If the standard PVD process were continued, as illustrated in the cross section of FIG. 3, the overhangs 108 would coalesce to form a bridge 112 over the contact hole 104, thus creating a void 114 in the deposited aluminum within the contact hole 104. Although the effect is exaggerated in FIG. 3, any included void reduces contact conductivity and introduces a reliability problem. FIG. 3 also shows that a depression 116 tends to form in the sputter deposited aluminum layer 106 over the contact. Even if the formation of voids 114 were avoided, the deposited metal is still insufficiently planar.

For aspect ratios of 1:1 or somewhat higher, the void and planarization problem can be solved by a reflow process. Aluminum tends to migrate or flow at temperatures near or above 480° C., and minimization of surface energy causes the migrating aluminum to fill any non-planar portions, thus completely filling the contact and planarizing the aluminum layer 106, as illustrated in FIG. 4, although a remnant depression 118 likely remains. Reflow can be performed continuously during the sputter deposition by holding the temperature of the substrate 100 at 480° C. or above. Alternatively a high-temperature reflow can be performed after a lower-temperature PVD process.

A typical hole-filling PVD deposition of Al with the cold-hot process to be described later in detail involves initially depositing a seed layer at high power, for a short time, and at a low temperature. The remaining layer is then PVD deposited at lower power, for a longer time, and at a higher temperature. The temperature in the latter step is sometimes referred to as the reflow temperature. It is possible to deposit all the aluminum at a lower temperature and then to reflow the deposited layer at a higher temperature without concurrently depositing further aluminum, but this process takes longer and may introduce discontinuities such as voids in the intermediate structure.

However, reflow is not a complete solution. First, reflow temperatures tend to be somewhat high and to consume a large part of the thermal budget for complex chips. Indeed, the required reflow temperatures may preclude certain low-temperature materials being included in previously formed layers. Advanced dielectrics such a fluorinated silicon oxides or organic polymers, such as polyimide or paralene, require maximum processing temperatures under 400° C. Secondly, reflow fails to avoid voids when the plugs become too narrow, for example, at aspect ratios of 2:1 and above, so that the illustrated geometry is at the edge of the utility of reflow.

Reflow fails to fill plugs with higher aspect ratios because the geometry prevents sufficient material being deposited into the plug hole prior to intense shadowing. The high temperatures of the reflow process also act to aggregate small amounts of the aluminum into hemispherical globules. The globules do not grow to sufficient size to coalesce into a smooth film that uniformly covers the surface before the plug hole is effectively closed off. This problem is partially caused by the fact that aluminum does not readily wet to silicon dioxide. Wetting can be explained in terms of the relative sizes of the surface tension of the free surface of the aluminum and the surface tension between the aluminum and the substrate. Aluminum wets well to Ti, moderately well to TiN, and poorly to $SiO_2$. Dewetting of aluminum over $SiO_2$ occurs above 250° C., the exact temperature depending on initial conditions among other parameters. That is, aluminum dewets at a lower temperature than that at which aluminum flows, and the separation of the wetting and flowing regimes prevents easy aluminum reflow unless further steps are taken.

One process intended to overcome this problem in filling narrow plugs problem is called coherent deposition. The particles of metal, e.g., aluminum, sputtered from the target are passed through a collimator with perpendicular apertures having fairly highly aspect ratios. As a result, only those particles traveling nearly perpendicularly to the principal plane of the collimator and hence the principal plane of the substrate freely pass through the collimator. That is, the isotropic ballistic pattern of the sputtered particles is changed to a nearly perpendicular pattern, and the particles can penetrate deeply into the aperture without the formation of shadowing overhangs. But this process is inefficient because the remainder of the particles adhere to the sides of the collimator apertures and the planar matrix portion of the collimator defining the apertures so that much of the sputtered aluminum is lost. A related process, called long throw, widens the separation between the target and the substrate so that the PVD trajectories become more perpendicular. However, since long-throw PVD uses only the nearly perpendicular sputtered particles, its sputtering rate is commensurately reduced.

In a comparative process combining coherent deposition with reflow, an initial coherent (directional) deposition of aluminum is performed at a relatively low temperature of the substrate, for example, 150° C., to form a seed layer within the plug hole. At these temperatures, there is no significant reflow and the atoms stick to the plug bottom 112 (see FIG. 2) where they initially strike. Because of the collimation, the overhang 108 tends to not develop. The geometry for deposition of a collimated beam on the side walls 114 is not favorable, but taking into account backscatter from the plug bottom 112 it is sufficient for a thin, fairly uniform layer to develop.

The collimated, low-temperature PVD is not continued long enough to fill the plug hole because of its uneconomically low deposition rates. Instead, after a stable seed layer has been deposited within the plug hole, the wafer is moved from a coherent PVD chamber to a standard isotropic (i.e., non-coherent) PVD chamber, in which a standard PVD process isotropically deposits aluminum at a high rate and with a substrate temperature ramping up eventually to a temperature sufficient to reflow the deposited aluminum. Because the newly deposited aluminum wets to the already deposited seed layer, the deposited aluminum readily flows as a layer that fills the plug without formation of a void and smooths the exposed layer to be substantially planarized.

It has been observed that very similar results can be obtained in a cold-hot standard, isotropic PVD process that sequentially deposits both the seed layer and the high-temperature, reflowed layer.

As an example of attainable results, if reflow is used to fill aluminum into an aperture with a depth of 1 .2μm and an aspect ratio of about 1:1, a substrate temperature of 480° C. will cause the aluminum to planarize in about three or four minutes. However, reflow has limited effectiveness if the width of the 1.2 μm-deep plug is reduced to 0.5 μm or less, that is, an aspect ratio of 2:1 or higher. Even when plugs are initially deposited by coherent PVD, a standard isotropic deposition process performed at an acceptably low reflow temperature still requires too much time to fill the high-aspect holes.

Although a higher substrate temperature during the high-temperature deposition promotes and accelerates the planarization of aluminum, if the substrate is too hot, the low-temperature seed layer will coalesce into globules and prevent the formation of a conformal film layer. Furthermore, above some substrate temperature for PVD, other previously deposited materials will dimensionally distort or thermally degrade.

Another known method for filling holes with high aspect ratios involves ionizing at least a fraction of the atoms sputtered from the target and then electrically attracting the ionized target atoms to the substrate. The field-controlled movement of the sputtered ions allows the field to be adjusted to cause the sputtered atoms or clusters to be traveling substantially perpendicularly to the plane of the substrate. Thereby, the sputtered material tends to reach to the bottom of the plug holes, as well as the bottom portions of the side walls, and will not collect on the upper edges of the plug holes.

For example, Barnes et al. in U.S. Pat. No. 5,178,739 describe a sputter deposition system which includes a hollow, cylindrical sputter target disposed between an end sputter target and a substrate, all of which are contained within a vacuum chamber. Magnets are disposed on the outside of the vacuum chamber but adjacent to the cylindrical target to increase the argon plasma density adjacent to the target and to thereby increase the amount of material sputtered from the target. RF power is inductively coupled into the chamber between the target and the wafer to create the plasma adjacent to the target. The high level of RF power coupled into the plasma creates a high-density plasma (HDP), which increases the fraction of target atoms that become ionized on their transit to the wafer. The pedestal on which the wafer is supported, and hence the wafer, are DC electrically biased to attract the ionized target atoms. The amount of wafer biasing determines the energy and the directionality of the target atoms as they strike the wafer. Thus, the ionized PVD process is designed so that the ionized target ions, after they pass through the plasma sheath adjacent to the wafer, have a low angular divergence and therefore can uniformly fill the bottoms of apertures, such as plugs, having high aspect ratios. As will be discussed below, other methods are available to create an HDP-PVD process.

Although ionized deposition of a metal is known to be able to fill deep holes, the technique manifests lower deposition rates than standard PVD, thus detracting from the economics of its use, the power requirements are greater, and the equipment is much more expensive than standard PVD equipment. Notwithstanding these disadvantages, many believe that ionized PVD will be required to fill holes with aspect ratios higher than approximately 2:1 and that other techniques, such as coherent PVD followed by standard PVD and reflow, cannot meet the needs of the industry as K line widths continue to shrink.

For contacts in which the aluminum filling the contact hole must electrically contact the underlying silicon, there are additional problems. If the aluminum were allowed to directly physically contact the silicon, the aluminum would diffuse into the silicon and severely disturb its semiconductive properties. Hence, a barrier layer must be formed between the silicon and the contact filling. The typical solution is to deposit a Ti/TiN barrier layer in the contact hole before the aluminum is filled into the plug hole. However, the Ti/TiN barrier layer is typically deposited by PVD, and the resultant TiN is relatively porous so that the aluminum can still diffuse through it. As a result, it has been common practice, as disclosed by Ngan et al. in U.S. Pat. No. 5,378,660, to anneal the PVD-deposited Ti/TiN layer at 450° to 480° C. or possibly somewhat above in an oxygen-containing environment. This treatment "stuffs" oxygen into the TiN pores so as to block any aluminum diffusion.

Normally, a layer of Ti or of a Ti compound such as TiN wets aluminum so that the aluminum tends not to bead on it and more readily flows over it. It is seen that wetting promotes the filling of narrow plug holes at moderate temperatures. However, oxygen stuffing of PVD-deposited TiN severely degrades its wetting properties. To circumvent this effect, Ong has suggested in U.S. Pat. No. 5,371,042 that another, wetting layer of Ti or a Ti-containing material be deposited over the oxygen-annealed TiN barrier layer. This process is more completely illustrated in the flow diagram of FIG. 5. In step 120, a standard PVD process is used to first deposit a Ti layer and to then deposit a TiN layer thereover. In step 122, the wafer is typically moved to a separate annealing chamber to be annealed in an oxygen environment. In step 124, the wafer is moved back to a PVD chamber for the sputter deposition of a Ti layer. In step 126, the wafer is moved to another PVD chamber for the sputter deposition of the aluminum layer in a first cold step followed by a hot, reflow step.

The Ong process seems to provide adequate hole filling for presently contemplated plugs and contacts. However, the process is overly complex, requiring at least two PVD depositions of Ti or TN separated by an anneal in oxygen. It is greatly desired to provide a simpler process for filling plugs of high aspect ratios.

For many applications such as vertical interconnects, the aluminum deposited to fill the contact or via is simultaneously deposited over the planar surface of the dielectric layer 102. Following the deposition of an unillustrated anti-reflection coating usually of TiN, this thin aluminum layer is thereafter photolithographically patterned, as illustrated in the orthographic view of FIG. 6, to form interconnect lines linking different elements by a predetermined wiring pattern, such as the illustrated interconnect 130 connecting two underlying contacts or vias 132, 134 although one or both of the vias 132, 134 may connect to the overlying layer.

For advanced integrated circuits, the wiring pattern can be very dense. Accordingly, the interconnect lines are made relatively narrow. However, the narrowness causes the required levels of current flowing through the interconnects between the electrical elements to produce relatively high current densities in the interconnects. It is a well known problem that high current densities in aluminum causes electromigration of the aluminum away from hot spots, such as caused by a localized small defect 136. But, the migration removes material from the hot spot 136, which reduces the cross section of the interconnect at that point and promotes yet further electromigration. As illustrated orthographically in FIG. 7, the electromigration may cause the hot spot around the small defect 136 to develop into a break 138 in the interconnect 130, thus destroying the electrical connection between the two plugs 132, 134. Thus, electromigration introduces a failure mechanism in which aluminum interconnects become disconnected after a period of use.

It is well known that when the aluminum is deposited on some types of crystallographically oriented TiN, electromigration is reduced. Kim et al. presents such results in "The effect of reactive-sputtered TiN on electromigration of Al alloy metallization", *Proceedings IEEE VMIC Conference*, Jun. 27–29, 1995 (104/95/0443), p. 443. Campbell et al. present a thorough investigation of the effect in "Relationship Between Texture and Electromigration Lifetime in Sputtered Al-1% Si Thin Films, *Journal of Electronic Materials*, vol. 22, 1993, pp. 589–596. Knorr et al. relate electromigration to crystallographic orientation of the deposited aluminum film in "The role of texture in the electromigration behavior in pure aluminum films," *Journal of Applied Physics*, vol. 79, 1996, pp. 2409–2417. It is noted that Knorr et al. report an ion content of 1 to 2% in one method of depositing aluminum. Kordic et al. describe a similar dependence upon crystallographic orientation for another failure mode in "Correlation between stress voiding of Al(Si)(Cu) metallizations and crystal orientation of aluminum grains," *Journal of Applied Physics*, vol. 74, 1993, pp. 5391–5394. In any case, it is greatly desired that whatever plug-filling process is developed be integratable with a planar process providing satisfactorily low electromigration in interconnects.

SUMMARY OF THE INVENTION

Accordingly, an object of the present invention is to provide a method of filling metal or other material into contacts, vias, and other apertures, especially those having high aspect ratios.

Another object is to provide such a method that is economical and exhibits a high deposition rate.

Yet a further object is to provide such a hole-filling process that is compatible with concurrent deposition of a horizontal metal interconnect level.

A still further object is to provide a method of depositing a planar layer of metal with superior crystallographic qualities.

These and other objects will become evident from an understanding of the specification and claims.

The invention can be summarized as a method of depositing metal by a PVD (physical vapor deposition) process that is particularly useful for filling apertures with high aspect ratios and is further useful for depositing a planar metal layer for later definition into interconnects. The process includes deposition of a liner layer by a PVD process using a high density plasma (HDP) followed by a PVD deposition of aluminum, preferably using a standard PVD process that provides a higher deposition rate. The liner layer includes one to three distinctive sublayers. The first sublayer, preferably of a refractory metal such as Ti, is applied particularly when the metal is being contacted to underlying silicon and includes Ti. The important, second sublayer is composed of a refractory compound, particularly a refractory nitride, such as TiN, which forms in a smoother, dense crystal structure when deposited by HDP-PVD. The third sublayer includes an upper portion of a refractory metal, such as Ti, and may be graded from TiN in its lower portion. It performs two functions. Its formation cleans the sputter target for the next wafer, and its refractory-metal surface promotes reflow in narrow apertures. The interconnect metal, preferably aluminum in present-day applications, is preferably deposited for hole filling by standard PVD in a two-step process, first a cold deposition and then a hot deposition, which can be performed in one or two chambers within a relatively low temperature range. The resulting crystallographic properties of the aluminum yields enhanced electromigration resistance. Furthermore, the HDP TiN layer followed by Al deposition can be applied to other structures not requiring planarization but benefitting from enhanced electromigration resistance due to the improved crystallographic structure.

BRIEF DESCRIPTION OF THE DRAWINGS

FIG. 5 is a flow diagram for a prior-art process of hole filling.

FIGS. 6 and 7 are orthographic views of a schematic representation of an interconnect and its failure mode due to electronigration.

DETAILED DESCRIPTION OF THE PREFERRED EMBODIMENTS

We have discovered that filling of a plug having a high aspect ratio can be facilitated by precoating the interior of the plug hole or other aperture with a liner layer. The liner deposition is performed by physical vapor deposition (PVD) utilizing a high-density plasma. The so formed liner layer is characterized by its strong crystalline orientation, high density, surface smoothness, and increased wetting relative to the after deposited metal, such as aluminum. The liner layer promotes the flow of the material being deposited by a standard PVD process to fill the aperture, and the filling process can be performed at relatively low temperatures significantly below 500° C., even below 400° C. Preferably, the liner layer is formed of a sublayer of TiN. No oxygen anneal or other oxygen treatment of the TiN is required for it to act as a barrier layer. When the underlying material to be electrically contacted is silicon, the TiN sublayer can be deposited over a sublayer of Ti, which can be silicided with the silicon by a high-temperature anneal. The interfacial layer of titanium silicide substantially reduces the electronic barrier height the metal-semiconductor interface and thus produces a good ohmic contact. A top sublayer of Ti cleans the target of nitrogen and further promotes reflow into narrow plugs.

We have also discovered for hole filling that the overlying metal layer, for example, of aluminum is preferably deposited in a two-step, cold-hot PVD process. Even the hot deposition can be performed at relatively low temperatures preferably in the 350 to 420° C. range or even lower.

Figure 1:
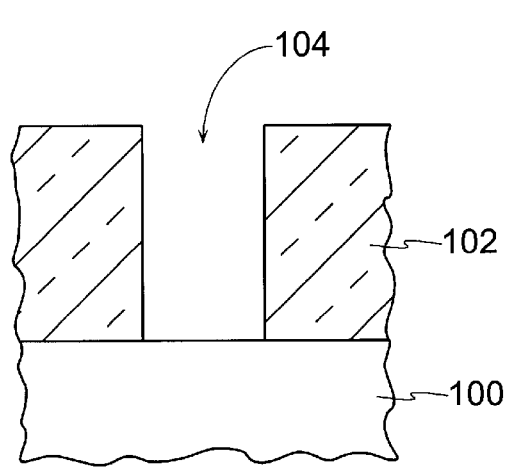
FIG. 1 is a schematical cross-sectional view of a contact or via hole extending through a dielectric layer in a semiconductor integrated circuit.
Figure 2:
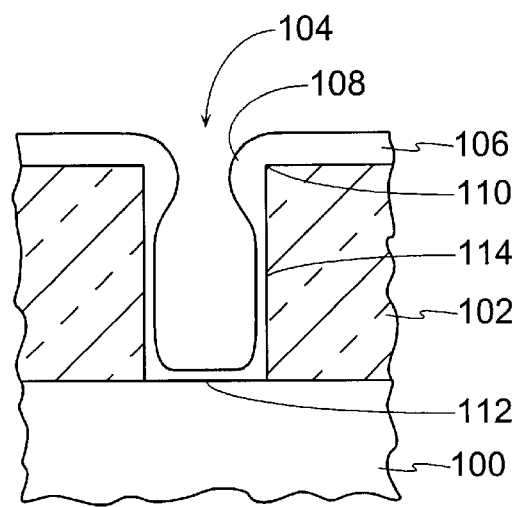
FIG. 2 is a cross-sectional view of the contact or via of FIG. I after it is partially deposited with a sputtered metal.
Figure 3:
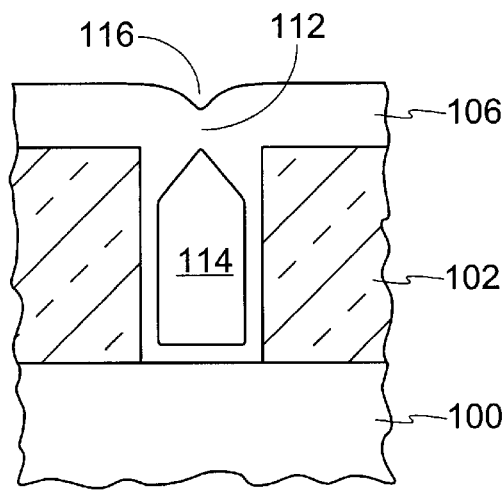
FIG. 3 is a cross-sectional view of a contact or via in which improper deposition has formed a void.
Figure 4:
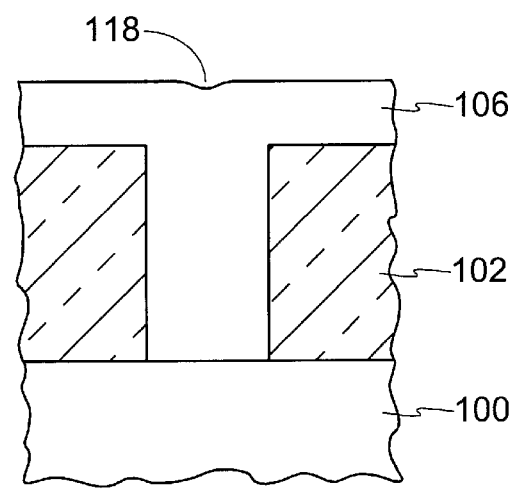
FIG. 4 is a schematical cross-sectional view of a contact or via in which the metal has reflowed to fill it and planarize the surface.
Figure 8:
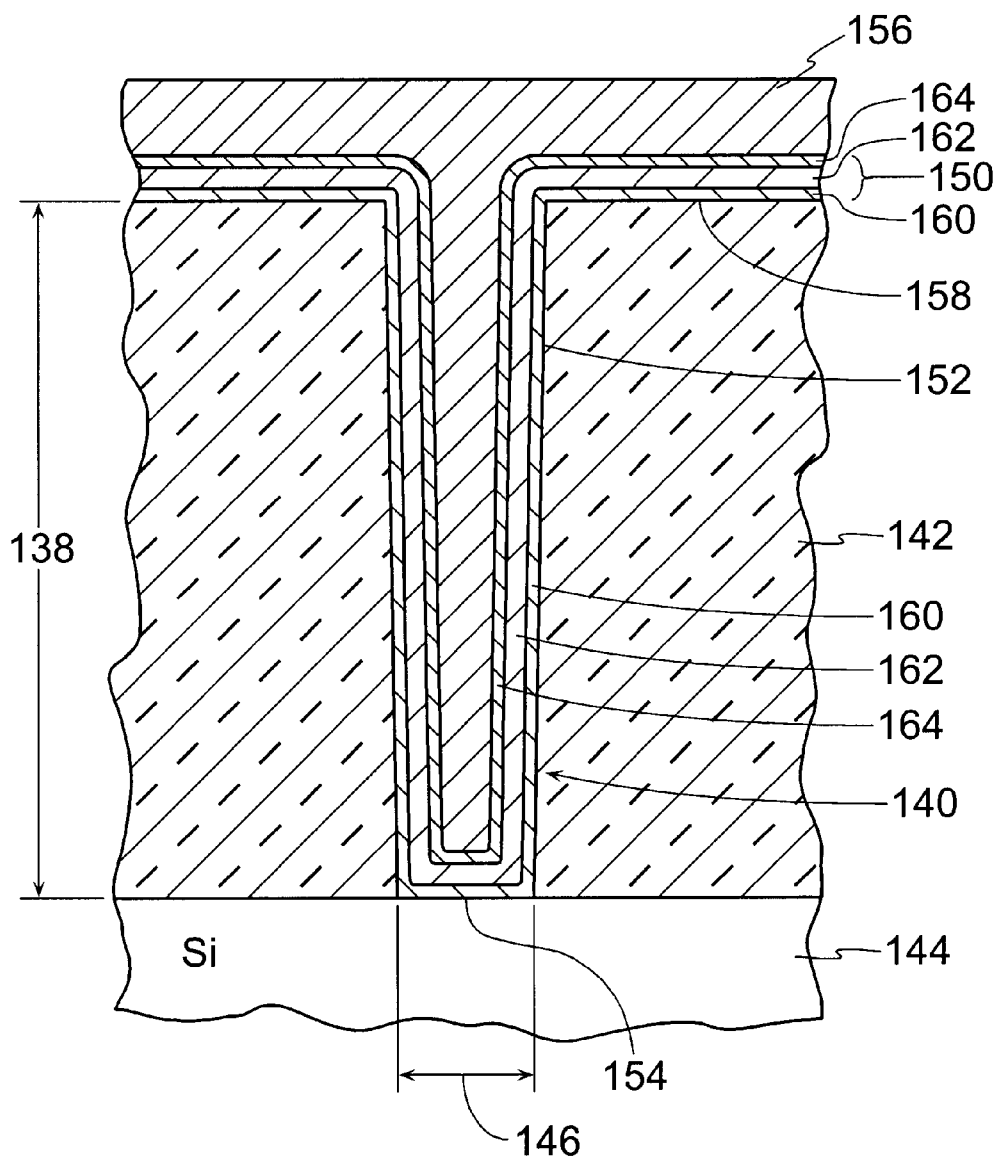
FIG. 8 is a cross-sectional view of a contact fabricated with the liner layer of the invention and thereafter filled with a metal.

The cross-sectional view of FIG. 8 illustrates an embodiment of the invention including a contact 140 through a dielectric layer 142 of, for example, silicon dioxide formed over a silicon substrate 144. The illustrated contact 140 through the dielectric layer 142 has an exemplary width 146 of 0.25 μm through the dielectric layer 142, which has an exemplary thickness 148 of 1.2 μm. Although the contact 140 is illustrated approximately to scale, the layers filled into the contact have somewhat exaggerated thicknesses for sake of clarity. Especially, the layer thicknesses on the contact side walls 152 are significantly exaggerated. The stated contact dimensions result in an aspect ratio for the contact 140 of about 5:1, which is the neighborhood in which the invention becomes crucial. It is known that a plug of these dimensions can be etched with $CF_4$ or $C_2F_6$ in the HDP Oxide Etch Chamber available from Applied Materials. However, filling such a plug, or a trench of equivalent dimensions, presents significant technological problems at the present time.

According to the invention, a PVD process utilizing a high-density plasma is used to coat a liner layer 152 onto the sides 152 and bottom 154 of the contact 140 of the dielectric layer 142 before a metal layer 156, preferably of aluminum or an aluminum alloy, is deposited into the contact 140 by a PVD process. The liner layer 152 is often referred to as a barrier layer although it assumes additional functions in the invention. Typically, the liner layer 152 is simultaneously coated onto the top surface 158 of the dielectric layer 142 so that the metal layer 156 not only fills the contact hole 140 but also extends laterally over the flat dielectric surface 158 intermediated by the liner layer 150. The liner and coater layers 150, 156 can then be photolithographically defined to form a surface feature, such as a metal interconnect joined to the contact 140.

The metal layer 156 may be functionally distinguished from the liner layer 152 or any of its sublayers. The liner layer and its sublayers operate as transverse thin films in the respect that they are expected to electrically conduct across the small dimension of the film, that is, its thickness. Therefore, although they do need to be conductive, the value of their conductivity is not critical and indeed TiN and even Ti exhibit conductivities markedly smaller than Al. However, the metal layer is expected to electrically conduct in a direction along a major dimension of the body. The major dimension may be the depth of the plug or the longitudinal extent of an interconnect. In either case, but particularly for the interconnect, a low resistivity of the metal layer becomes crucial.

THEORY OF HDP-PVD AND PRESSURE DEPENDENCE

Although the invention is not limited by the theory that we believe explains its effect, the following explanation includes our understanding of some of the mechanisms of the invention.

It is believed that the HDP-PVD process preferred for the liner layer causes the sputtered particles to be fully or partially ionized with ionization fractions in the range of 10% to 100%. The ionization fraction is primarily controlled by the RF power level and the pressure of the process gas. The ionization fraction is not usually directly measured, but the degree of ionization is monitored by visual inspection of scanning electron micrographs (SEMs) showing the resultant filling of narrow plugs. It is further believed that ionized sputter particles are electrostatically attracted to a DC biased substrate and that this attraction can be used to effectively coat the bottom of a narrow plug hole and to coat the sides with a thinner layer. It is understand that DC biasing of the substrate can be accomplished with RF biasing of the substrate hole which creates a DC self bias. Indeed, direct DC biasing is not preferred because of charge build up on dielectric portions of the wafer.

A high-density plasma is considered to be one which substantially fills the entire volume it is in and has an average ionization density of greater than $10^{11} cm^{-3}$. A plasma that substantially fills a volume is not expected to fill the boundary layers (sheaths) and is not expected to fill shadowed volumes, such as volumes behind small aperture. The volume filling requirement is imposed to distinguish over plasma sources that have localized plasma densities above $10^{11} cm^{-3}$ but are not considered HDP sources because their plasma density, when averaged over the entire volume of the plasma, is much lower. For example, a standard magnetron sputter source has very high plasma densities in the erosion track near the target, but the density is much lower even a short distance away from the target. A preferred method of measuring the plasma density is by use of a Langmuir probe, as described by Hopwood et al. in "Langmuir probe measurements of a radio frequency induction plasma, *Journal of Vacuum Science and Technology A*, vol. 11, 1993, pp. 152–156. Such high-density plasmas can be achieved by a number of methods, some examples of which are presented below.

When particles are sputtered from the target, they are generally neutral. They can be ionized as they pass through a high-density plasma intervening between the target and the substrate. The resulting metal sputter ions can be directed to the substrate by suitably biasing the substrate. Further, the substrate bias can be used to control the incident energy of the metal ions, thus providing a tool for achieving denser and smoother films.

Two ionization processes are responsible for ionizing the sputter atoms as they pass through the high-density plasma and interact with particles in the plasma particles. Collisions between the sputter atoms and electrons in the plasma can ionize the sputter atoms if the electrons have an energy greater than the ionization potential of the atoms. The ionization potentials of some commonly sputtered metals are given in TABLE 1.

TABLE 1

| Metal | Ionization Potential (eV) |
| --- | --- |
| Aluminum | 5.98 |
| Titanium | 6.83 |
| Copper | 7.72 |
| Tungsten | 7.98 |

In the second ionization processs, collisions between the sputter atoms and metastable neutrals of the background gas can also ionize the sputter atoms in a process known as Penning ionization. Argon is the most commonly used background gas in sputtering. Since it possesses a metastable energy level at around 12 eV, metastables can be a significant source of ionization.

The preferred PVD plasma reactor, to be described later in detail with reference to FIG. 10, generates the high-density plasma by means of inductive coil wrapped around the side of the chamber and connected to an RF power source. RF power fed to the coil creates via a generally axial magnetic field an electric field inside the chamber that is generally azimuthal and is sufficiently strong to cause breakdown of the background gas (argon). The coil and plasma can be thought of as a transformer, where the coil is the primary winding and the plasma is a one-turn second winding. The current induced in this secondary winding is primarily composed of circulating electrons.

Plasma density is generally linearly dependent on RF power applied to the coil so that doubling the RF power doubles the plasma density. However, DC power applied to the target tends to lower the plasma density, and the electron energy in the plasma drops as more sputtered atoms are added to the plasma. Thus, the fraction of ionization of the sputter atoms increases with increasing RF power and decreases with increasing DC target power.

The probability of ionization of the sputtered metal atoms depends on both the plasma density as well as the length of time the metal atom spends in the plasma. In typical low-pressure sputtering, the sputter atoms are ejected from the target with significant energies, on the order of 1 to 10 eV. They thus travel quickly toward the target, leading to a low probability of ionization. The ionization probability can be dramatically increased by ensuring that they collide with particles in the plasma, which collisions both reduce their energy and randomize their directions. The collision probability is increased by operating the plasma at higher gas pressures. Once the ion's energy has been reduced, its velocity perpendicular to the wafer surface can be increased by substrate biasing.

Figure 9:
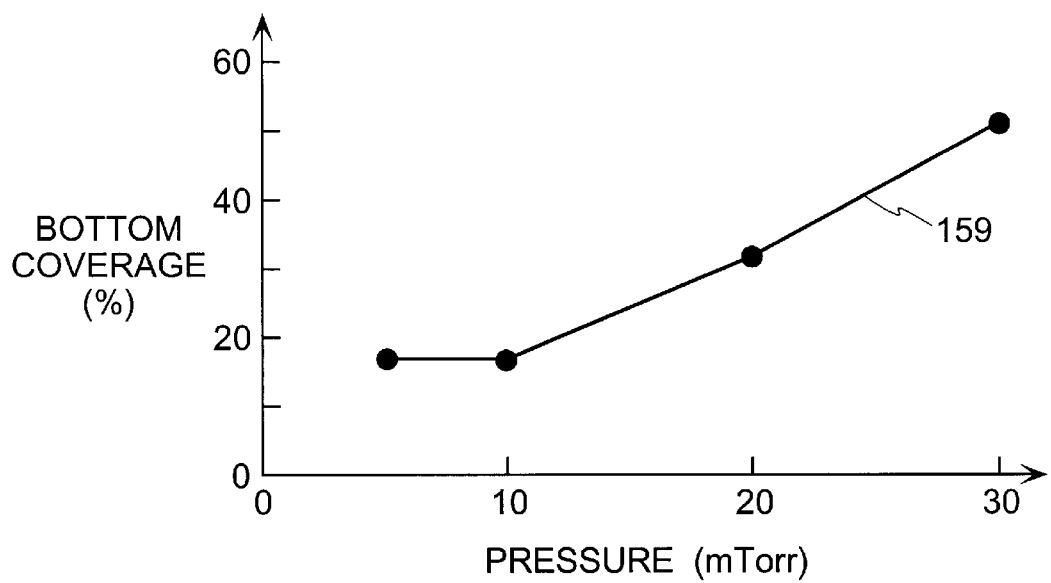
FIG. 9 is a graph of the dependence of bottom coverage on pressure in a high-density plasma.

An experiment was performed in which atoms were sputtered from a titanium target in an argon background gas into apertures with high aspect ratios. Bottom coverage was measured for various argon pressures. Bottom coverage compares the thickness of metal deposited at the bottom of the aperature with the thickness deposited on the planar surface. The results, shown by trace 159 in FIG. 9, shows that at 10 mTorr and below, the bottom coverage was below 20%. The bottom coverage increased above 10 mTorr, and at 30 mTorr was about 50%. It is expected that the dependence will approach an asymptote around 50 mTorr. These data show that the pressure during sputtering should be above 10 mTorr, preferably 30 mTorr or greater. These values are dependent upon the geometry of the aperture, the target material, and the chamber design so that a preferred pressure range between about 1 mTorr and 100 mTorr is anticipated.

The directionality of the sputter atoms incident on the substrate is determined by the substrate bias, and for deep hole filling the velocity component perpendicular to the wafer plane should be much greater than the parallel component. The electrostatic attraction of the substrate bias increases only the perpendicular component while high-pressure operation decreases the parallel component, as well as the perpendicular component, prior to electrostatic attraction. Even without specific substrate biasing, the incident ions exhibit some directionality because a difference exists between the plasma potential and the floating potential of the wafer. The floating potential is on the order of −2V. We have not measured the plasma potential, but it is expected to be on the order of 10 to 30V. Any potential difference between the substrate and the plasma appears only in the thin boundary layer between the generally neutral but conductive plasma and the substrate. This boundary layer is known as the plasma sheath, which for high-density plasmas has a width of less than 1 mm.

CONTACT STRUCTURE

A first embodiment of the liner layer 150, as illustrated in FIG. 8, includes three sublayers. The materials given for this embodiment are not exhaustive of possible materials to be used with the invention.

A first sublayer 160 comprises titanium that has been sputtered from a Ti target and that was partially or fully ionized during the sputtering process. The first sublayer 160 may be silicided with the underlying silicon 144 by a high-temperature annealing step. The first sublayer 160 is not so strongly needed if the underlying substrate is a metal, such as a metallic interconnect.

A second sublayer 162 comprises a titanium compound, preferably titanium nitride. The titanium nitride is preferably reactively sputtered. In this process, the titanium is sputtered from a Ti target and is also ionized. It reacts with nitrogen gas filling the plasma reaction chamber to a reduced pressure, and the reacted compound TiN is coated onto the wafer.

A third sublayer 164 is a graded layer of sputter deposited material that begins as TiN and ends as relatively pure Ti. This sublayer 164 will often be referred to as the $TiN_x$ layer, where x is the atomic percentage and varies from about 1 to 0, although its composition could also be designated as $Ti_yN_x$, where $y \geq x$.

The total thickness of the liner layer 152 is approximately 80 nm as measured on the planar top surface 158 although the thickness may be in the range of 5 to 100 nm, preferably 40 to 80 nm. The formation of the three sublayers 160, 162, 164 by ionized PVD assures that they coat to some extent the sides 162 and especially the bottom 154 of the contact hole 140.

The liner layer 152 deposited by HDP-PVD appears to have three characterizations that promote effective filling of the contact hole 140 with aluminum and which advantageously promote a highly oriented crystal structure within the over deposited metal.

First, the HDP-PVD deposition of the liner layer 150, both the principally elemental titanium sublayer 160 and the reactively sputtered TiN sublayer 162, provides high bottom coverage in depositing a layer that covers the bottom 154 of the contact 140. It is believed that the ionization of at least a substantial fraction of the sputtered particles causes them to be attracted at a perpendicular angle to the surface of the wafer 144 and thus able to penetrate far into the deep and narrow contact hole 140. Coating of the sidewalls 152 is much less effective but still occurs to about 10% coverage.

Secondly, the HDP-PVD deposition produces a liner layer 152 that has a very smooth surface. It is believed that this effect originates in the Ti and TiN sublayers 160, 162. Scanning electron micrographs show that the TiN portion of the so deposited liner layer has a dense crystal structure with a very smooth surface, and the crystal structure exhibits a high material density. It is believed that both effects arise from the ionized sputter particles striking the substrate at relatively high energies of about 10 eV, in contrast to reflow where the mean thermal energies are much lower. The SEMs show that the surface has a surface roughness of about 1.5 nm RMS (root mean square), which is about a third of the prior-art values of 4 to 5 nm with traditionally sputtered layers. Surface roughness is measured by visually inspecting the SEM cross sections of the surface and determining both an average surface level and upper and lower surface excursions. The RMS value of the excursions are determined by normal statistical sampling. The high density implies that the HDP-deposited TiN is not porous and hence does not need to be annealed in oxygen to stuff any porous passages. That is, the as deposited HDP TiN provides an effective barrier layer.

Thirdly, the so formed liner layer 150 exhibits a high degree of wetting to the after deposited material, specifically aluminum and its alloys. Because of the strong wetting at the interface between the liner layer and the aluminum, the surface tension on the exposed surface of the aluminum is sufficiently low that the aluminum does not bead, and thus the wetting favors the aluminum to flow along the walls of the contact hole 140 at reasonably low temperatures over reasonably short times. Even the TiN sublayer provides good wetting and does not need to be stuffed with oxygen although the wetting although the wetting is less than that provided by Ti.

Additionally, if the underlying material is silicon, the liner layer 150 performs two additional functions. The TiN part of the liner layer acts as a barrier layer between the aluminum and the silicon substrate 144, thus preventing the aluminum from migrating into the silicon and affecting its sensitive semiconductive characteristics. Although the silicon substrate 144 may be a polysilicon level, line, or other feature, it may also be a doped crystalline area constituting part of a transistor, for which doping concentrations are critical. Also, the lowermost, Ti sublayer 160 can be silicided to the silicon substrate 144. That is, after the titanium is deposited on the silicon, and typically after the first two sublayers of the liner layer are deposited, the wafer can be annealed at a sufficiently high temperature of 600° C. or higher to cause portions of the Si underlayment and Ti layer near their interface to diffuse together and form an alloyed region of graded composition. The siliciding aids the formation of an ohmic contact by reducing energy barriers at the interface.

With the liner layer 150 of the above described composition, the metal layer 156 can be deposited by traditional PVD processes, and a reflow process that is performed at relatively low temperatures and for relatively short times can still fill the contact 140 without the formation of voids. Preferably, as will be described in detail later, the aluminum deposition is a two-step PVD process, with a short initial cold deposition followed by a longer hot deposition. More data will be presented later, but practical reflow temperatures have been observed which are below 480° C. and as low as 350° C. and the lower temperature limit is expected to be 320° C. for many material combinations and a reasonable reflow period. For example, reflow at 390° C. for 2 minutes or reflow at 350° C. for 10 minutes will fill the contact hole. Thus, contrary to some suggestions in the prior art, ionized deposition for all of the plug filling is not required. Also, the lower reflow temperatures allow PVD to be performed after temperature-sensitive elements have already been formed. The standard PVD deposition for the bulk of the metal deposition is much preferred because of its higher deposition rates, which greatly increases the throughput possible in the system. Also, the use of standard PVD to deposit the metal layer 156 significantly lowers the cost and complexity of the PVD system.

HDP-PVD CHAMBER

Figure 10:
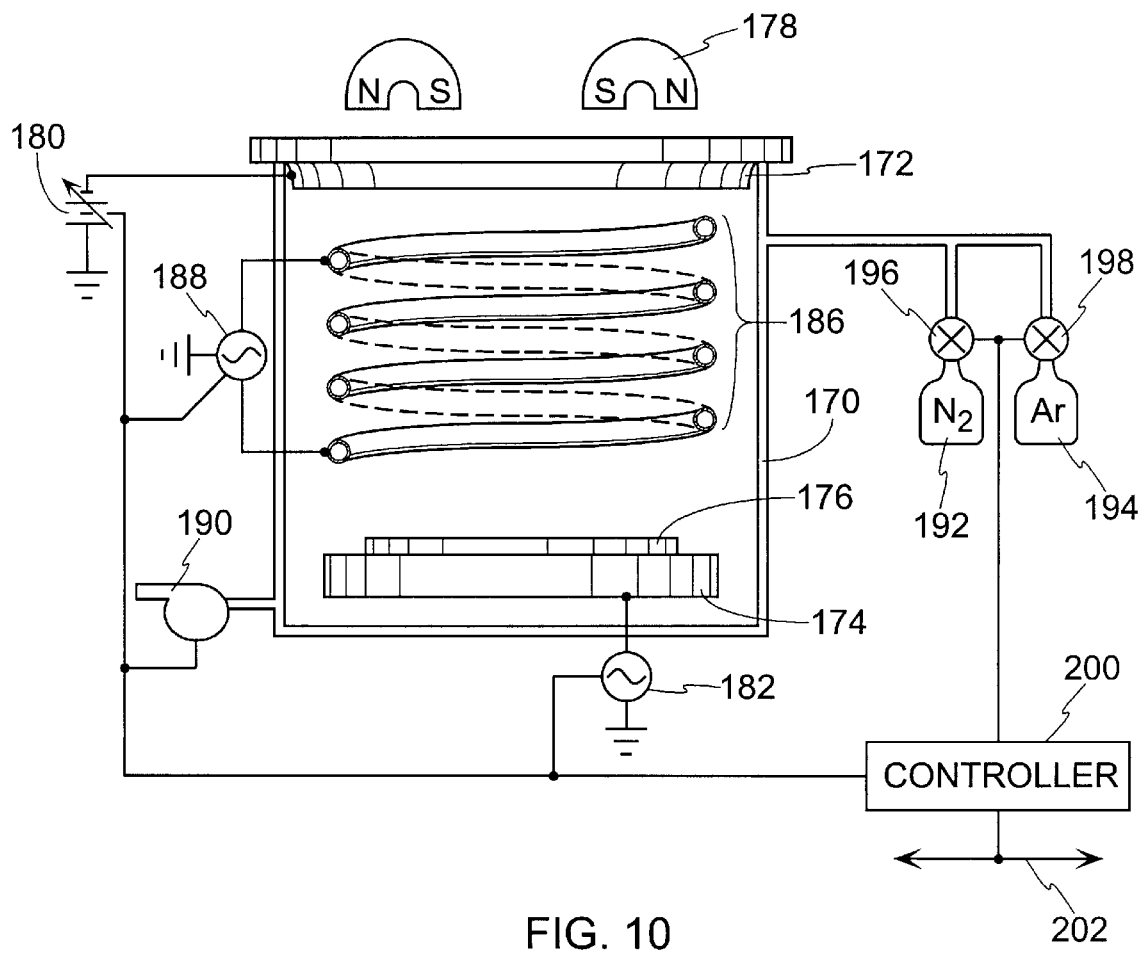
FIG. 10 is a schematic elevational illustration of a reaction chamber capable of performing physical vapor deposition (PVD) with a high-density plasma (HDP).

An example of an HDP-PVD plasma chamber is illustrated in FIG. 10. A vacuum chamber 170 encloses a space including a sputtering target 172 and a substrate pedestal 174 supporting a wafer 176 being processed. The sputtering target 172 forms part of the wall of the vacuum chamber 170 but is electrically isolated from the rest of it. A rotating array of sputter magnets 178 disposed on the back of the target 172 forms a magnetron target assembly that creates an intense plasma adjacent to the target 172 so as to increase the sputtering rate. A DC power source 180 negatively biases the sputtering target 172 with respect to the substrate pedestal 174 so that the target 172 acts as a cathode and the chamber wall 170 acts as an anode. The negative voltage partially supports an argon plasma within the vacuum chamber 170 and then attracts the ionized argon atoms to strike the target 172 with sufficient energy to sputter particles from the target 172. An RF power supply 182 is connected to the substrate pedestal 174 to DC self-bias the pedestal 174 with respect to the plasma and thus to control the energy of particles striking the wafer 176.

To achieve a high-density plasma, an inductive coil 186 surrounds the space between the target cathode 172 and the pedestal anode 174, and another RF power source 188 is connected across the coil 186. The coil 186 inductively couples a large amount of RF energy into the plasma. The exact configuration of the walls of the vacuum chamber 170 and the coil 186 is not critical to this invention, and FIG. 10 is meant to be schematic only. Hence, although the coil 186 is shown to be within the vacuum chamber 170, it is possible to place it on the exterior of a cylindrical dielectric wall forming a side of the vacuum chamber 170, and other shapes and locations of the coil are possible.

We believe that the additional energy supplied by the coil 186 to the plasma causes substantial ionization of the sputtered particles traversing that plasma. We further believe that the fraction of ionization increases with the ratio between the RF power supplied to the inductive coil 186 and the DC power supplied to the target cathode 172. A ratio of RF to DC power in the range of 20 to 60% seems preferable for the geometry of the HDP-PVD chamber being used although ratios of up to 200% may be needed for other geometries. The effects of the ionization become more pronounced as the DC self bias produced by the RF power supply 182 on the substrate pedestal is increased to thereby draw the ionized particles further into the plug hole.

A vacuum pump system 190 maintains a base pressure within vacuum chamber 170 at a strong vacuum, preferably below $10^{-7}$ Torr and typically around $2 \times 10^{-8}$ Torr in the absence of controlled gas feed into the chamber. Nitrogen and argon are supplied into the chamber 170 from respective sources 192, 194 in amounts controlled through respective mass flow controllers 196, 198 by a computerized chamber controller 200, which may be linked to a system controller over a bus 202. As will be described below in detail, plug filling depends strongly on the pressure maintained in the chamber 170 during HDP sputtering, and the pressure should be between 0.1 and 60 mTorr, preferably above 30 mTorr.

Similar HDP-PVD systems are known, such as the one described by Keeble in U.S. Pat. No. 4,844,775. The system used in the experiments described below will be described in some more detail although more precisely defined process parameters will described in the examples. The experimental system can process 8-inch (200 mm) wafers. The active portion of the target 172 is made principally of titanium for the sputter deposition of titanium or titanium nitride although it is well known to alloy the titanium in the target. The target 172 has a diameter of 14 inches (35.5 cm) and is spaced from the pedestal 174 by about 5 inches (12.7 cm). Although the target 172 can absorb power up to about 24 kW of DC power, in the experiments the DC power was limited to between about 3 kW to 5 kW. The coil 186 has three turns and is composed of metallic tubing of diameter of 0.25 inch (6.4 mm) through which cooling water passes although other configurations are easily adapted. Its RF source 188 operates in the range of 2 to 4 MHz with a typical RF power of 1.5 kW although other frequencies can be used, such as the standard 13.56 MHz.

Although the inductively coupled HDP-PVD system of FIG. 10 is preferred, other HDP-PVD systems are known which are capable of creating a high-density plasma and ionizing the sputtered material. Such PVD systems include an ECR (electron-cyclotron resonance) source, as described by Matsuoka et al. in U.S. Pat. No. 4,911,814, incorporated herein by reference, or a helicon-type coupling devices, as described by Campbell et al. in U.S. Pat. No. 4,990,229, incorporated herein by reference. Yet other types may be possible which provide a sufficiently high density of plasma so as to ionize the sputtered particles.

The HDP-PVD reactor is contrasted to a standard PVD reactor. By more standard PVD processes is meant currently practiced commercial PVD processes, for example, as practiced on the Endura PVD System available from Applied Materials. This standard PVD system includes a target that is DC biased relative to the wafer so as both to excite the plasma and to attract the ionized argon sputtering ions to the target, which then sputter particles from the target, which however remain for the most part neutral. The standard PVD reaction chamber does not generate a high-density plasma and commercial versions differ from the HDP-PVD chamber of FIG. 10 in the lack of the inductive coil 186 and RF source 182 for the pedestal 174, which is instead left electrically floating with respect to the target 172 and isolated from ground. The previously mentioned Applied Materials Endura PVD System is not considered a high-density plasma system, and no means are specially provided to ionize the flux of sputtered metal particles. It is estimated that the metal ionization fraction, i.e., the fraction of sputtered particles which are ionized, is less than 10% and typically less than 1% in standard PVD systems. The invention allows the entire metal layer 156 to be deposited in HDP-PVD systems, but such a uniform process suffers from low throughput because HDP-PVD usually deposits material at a much lower rate than traditional PVD and also requires more expensive reactors.

CLUSTER TOOL

Sputtering is a process that requires a very high vacuum and many sputtered layers are quickly degraded in the presence of even small amounts of oxygen. Therefore, it is preferred that some if not all of the steps of the invention are performed in a multi-chamber cluster tool, such as the Endura platform 210, illustrated in FIG. 11. The Endura platform is functionally described by Tepman et al. in U.S. Pat. No. 5,186,718, and an earlier multi-chamber cluster tool is described by more detail by Maydan et al. in U.S. Pat. No. 4,951,601. The Endura platform is used by Ong in the previously cited patent. The three above cited patents are incorporated herein by reference.

Wafers are loaded into the system 210 by two independently operated loadlock chambers 212, 214 configured to transfer wafers into and out of the system from wafer cassettes loaded into the respective loadlock chambers. The pressure of a first wafer transfer chamber 216 to which the loadlocks can be selectively connected via an unillustrated slit valve can be regulated between the atmospheric or somewhat lower pressure of the cassette to a moderately low pressure, for example in the range of $10^{-3}$ to $10^{-5}$ Torr. After pump down of the first transfer chamber 216 and the selected loadlock chamber 212, 214, a first robot 218 located in the first transfer chamber 216 transfers the wafer from the cassette to one of two wafer orienters 220, 222 and then to a degassing orienting chamber 224. The first robot 218 then passes the wafer into an intermediately placed plasma pre-clean chamber 226, from whence a second robot 228 transfers it to a second transfer chamber 230, which is kept at a significantly lower pressure, preferably below $10^{-7}$ Torr and typically $2 \times 10^{-8}$ Torr. The second robot 228 selectively transfers wafers to and from reaction chambers arranged around its periphery, for example, two HDP-PVD chambers 232, 234 and two standard PVD chambers 236, 238, selectively opened to the second transfer chamber 230 by unillustrated slit valves. After the low-pressure PVD processing, the second robot 228 transfers the wafer to an intermediately placed cool-down chamber 240, from whence the first robot 218 withdraws the wafer and transfers it a standard PVD chamber 242. The PVD chamber 242 deposits on the wafer a TiN layer of controlled thickness and dielectric constant which serves as an anti-reflection coating (ARC) over the metal layers just deposited in the PVD chambers around the second transfer chamber 230. The ARC layer faciliatates photolithography of the highly reflective metal layers. After ARC deposition, the wafer is transferred to a cassette in one of the two loadlock 212, 214. Other configurations of the cluster tool and associated chambers are possible.

The entire system is computer controlled by a system controller 250, which can be a personal computer, a work station, a minicomputer, or other similar digital control equipment communicating to the system and its various chambers, valves, and robots through the control bus 202. Although represented as a single entity, it may include a single master controller and several subcontrollers, such as the chamber controller 200 illustrated in FIG. 10, associated with various chambers and robots. The process of the invention is ultimately dictated by the system controller 250 through programs and recipes loaded into the system controller 250 by loading means such as transferable media 254, such as a floppy disk, an optical CD-ROM, a magnetic tape, or other similar media onto which the programs or recipes are recorded in the normal fashion. Alternatively, the loading means may include a communication link 256 connected locally to a terminal or connected remotely through a data link to an office of the system supplier or maintainer through which the programs or recipes are transferred according to communication protocols.

CONTACT PROCESS

Figure 12:
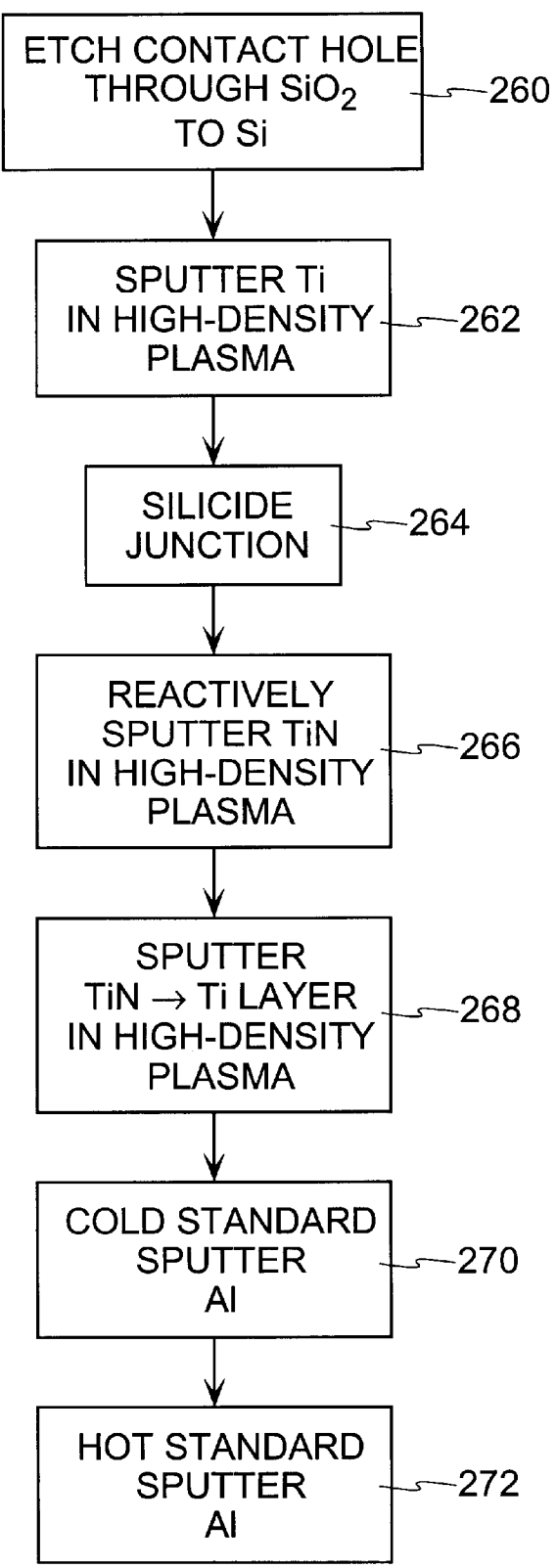
FIG. 12 is a flow diagram for a process embodiment of the invention.

A typical process for forming a contact of the invention to an underlying silicon layer will now be described with concurrent reference to the contact structure of FIG. 8, the HDP-PVD chamber of FIG. 10, and the process steps of FIG. 12. The wafer is processed prior to the steps of the invention to form the desired silicon surface structure, for example, a lateral MOS transistor. The dielectric layer 142 is deposited over the silicon substrate 144, and in step 270 the contact hole 140 is etched through the dielectric layer 142 to reach the silicon 144. All these processes are well known and are performed on standard semiconductor processing equipment for etching, CVD (chemical vapor deposition), photolithography, photoresist stripping, and other well known processes. It is assumed that the contact hole 140 is sufficiently deep and narrow that it has a high aspect ratio that is difficult to fill by standard PVD processes.

Figure 11:
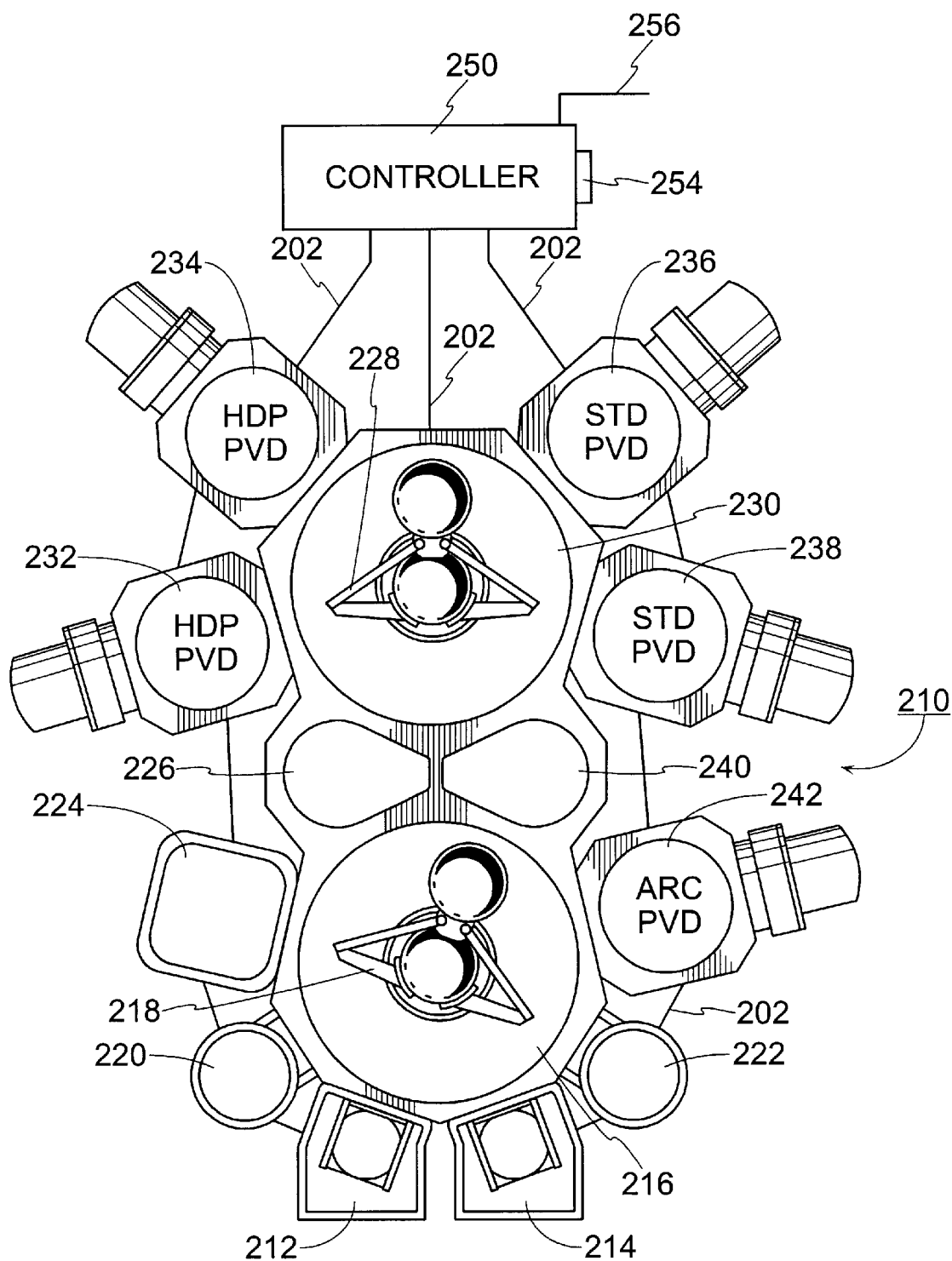
FIG. 11 is a schematic plan illustration of a multi-chamber cluster tool with which the invention can be practiced.

After the completion of the non-PVD portions of the illustrated structure of FIG. 8, the partially processed wafer 176 is transferred to the multi-chamber cluster tool 210 of FIG. 11, which has the advantage of allowing all of the PVD steps to be performed without exposing the wafer to air and its oxidizing effects. The process described below should be performed with oxygen partial pressures in the low-pressure PVD area in and around the second transfer chamber 230 kept well below $-10^{-6}$ Torr, preferably below $5 \times 10^{-7}$ Torr, and most preferably below $5 \times 10^{-8}$ Torr. Although oxygen stuffing would perhaps promote the barrier qualities of the HDP-grown liner layer, it would detract from its wetting quality. As described before, various chambers of the cluster tool 210 performs preliminary processing on the wafer 176 including orienting, degassing, and plasma precleaning as well as the post-PVD step of depositing the anti-reflection coating. Since these steps are well known and not directly involved in the invention, they will not be described here in detail.

For the liner layer depostion, the wafer 176 is placed atop the pedestal 174 of the HDP-PVD reaction chamber. For the deposition of a refractory metal layer of titanium, the PVD target 172 is formed of titanium or a titanium alloy.

To begin a first HDP sputtering step 262 for the liner layer, the HDP-PVD chamber is pumped down and filled with argon at a reduced pressure. The cathode and coil power sources 180, 188 are turned on to create a high-density argon plasma, and the anode power source 182 is turned on to DC self-bias the wafer 176. The argon sputters the target 172, and the resulting titanium particles in traversing the high-density plasma are at least partially ionized. The self-bias on the wafer 176 causes the ionized Ti particles to strike the wafer 176 in directions approximately normal to the wafer principal surface, thus providing high coverage of the bottom 154 of the contact hole 160 with a high-aspect ratio but with reduced coverage of the sides 152. The Ti also coats the planar top 158 of the dielectric layer 142 in forming the first sublayer 160 of the liner layer 150, specifically the refractory metal layer. A typical deposition forms a planar surface layer of Ti with a thickness of 20 nm, and a layer of thickness of 14 nm is formed on the bottom 154 of the contact hole 140 having a 1.2 µm width and a 5:1 aspect ratio. That is, bottom coverage is about 70%. Other Ti thickness may be used with the invention. A minimum thickness of about 2 nm is preferred for the bottom of the aperture. Thicknesses above 50 nm can be used, but they appear unecomical for most current applications.

After the Ti sublayer 160 of the liner layer 152 have been deposited, the junction between the Ti and Si is silicided in step 264 in one of the standard PVD chambers 236, 238 or preferably in a separate RTP (rapid thermal processing) chamber, a metal-anneal chamber (which may be heated by a lamp-irradiated susceptor), or a furnace, all of which may, but not need be, attached to the Endura platform. The siliciding is not required for vias not contacting silicon. The siliciding may include annealing at temperatures above about 600° C., and preferably at 750° to 850° C. in a non-oxidizing nitrogen ambient, as disclosed by Ngan et al. in the above cited patent. To minimize the total thermal budget, the silicidation is preferably performed by rapid thermal annealing. The siliciding may be delayed until after the deposition of the TiN sublayer, but it should not be delayed until after the deposition of the top Ti sublayer since the hot nitrogen-rich siliciding environment would convert the Ti to TiN.

In a second HDP sputtering step 266 for the liner layer, nitrogen is also admitted into the same HDP-PVD chamber to form an argon-nitrogen mixture. The high-density plasma is continued so that the sputtered titanium is partially ionized. The titanium reacts with the nitrogen during the deposition process and is deposited on the wafer as TiN. A typical deposition forms a planar surface layer of TiN having a thickness of 80 nm and a layer at the bottom of the narrow contact hole 140 having a thickness of about 54 nm, that is, bottom coverage of 68%. A minimum thickness of TiN at the bottom of the hole is expected to be about 10 nm. Maximum thickness depend upon several factors. For a narrow aperture, it should be substantially less than the aperture width to allow space for metal filling. For more planar structures, a thicker TiN layer increases the total resistivity. Thus, in most situations thicknesses of greater than 200 nm seem counterproductive.

In a third HDP sputtering step 268 for the liner layer, the supply of nitrogen to the same HDP-PVD chamber is stopped while the high-density plasma continues, and another layer of titanium is sputter deposited to form the third sublayer 164 of the liner layer 150. However, the transition from reactive sputtering of titanium in a nitrogen environment to pure titanium sputtering produces a graded layer of $TiN_x$ having a higher content of nitrogen (x≈1) near its interface with the TiN sublayer 162 and being substantially pure titanium (x≈0) on its other side. A typical deposition deposits 10 nm on the surface and 6 nm at the bottom of the contact hole, for a bottom coverage of 60%. The so formed layer constituted about 10% TiN initially formed on the bottom of the third sublayer 164. Data will be presented later showing that in many cases only a minimal amount of upper Ti needs to be deposited, probably 2 to 10 nm and that the thickness is preferably limited to 60 or 100 nm.

Bottom coverage for all three sublayers should be relatively high for effective use of the invention for hole filling. Values below 20% are not preferred since the hole is not being effectively filled. Although 100% would be desirable, values above 90% indicate that the process is not being sufficiently pushed.

During a typical operation, the supply of nitrogen is abruptly cut off from the chamber at the beginning of the third deposition step 268. However, in the previous TiN deposition step 266, a large amount of nitrogen has been introduced into the chamber 170 and in particular has reacted with the Ti target 172 to form a TiN surface on the Ti target 172. Thus, at the beginning of the of the third PVD step 268, a substantial amount of TiN is sputtered from the target 172 until all nitrogen is removed from the target 172. A principal reason for the third deposition step 268 is to clean the Ti target 162 of nitrogen so that, when the next wafer is processed, the Ti deposition of step 262 does not deposit any nitrogen on the silicon, which could adversely affect its semiconductive properties. The need for the third deposition step 268 depends on many factors. If the plug is being used to interconnect two metal layers so that the bottom of the plug contacts another metal, the target cleaning of the third deposition step 268 is not required for target cleaning because the possible nitrogen contamination does not greatly affect plug contact to the lower metal. Later data will show that some minimum layer of nitrogen-deficient metallic Ti should be formed over the TiN to promote aluminum reflow into narrow plugs, at least for the material parameters of the data. The universal need for the top Ti wetting layer for all plugs, especially wide plugs, and for planar depositions has not been demonstrated.

Although the described step 268 of depositing the graded TiNE sublayer abruptly cut off the supply of nitrogen, it is possible to more gradually reduce the nitrogen supply so as to tailor the grading from TiN to Ti.

As described in the embodiment above, the three HDP-PVD deposition steps 262, 264, 266 for forming the liner layer are preferably performed in the same HDP-PVD chamber with the three steps distinguished by changes in the gas composition and possibly the power levels under the control of controllers 200, 250 although it is possible to use separate chambers for the different sublayers. It is believed that the HDP-PVD process is crucial only for the TiN sublayer 162, although this restricted criticality has not been proved, so that standard PVD chambers could be used for the upper and lower Ti sublayers 160, 164 if satisfactory bottom coverage can be otherwise achieved. However, to complete the plug filling as economically as possible, after the deposition of the liner layer 150, the wafer should then be transferred to a traditional sputtering chamber 236, 238 for the deposition of the interconnect metal, which is typically aluminum or an aluminum alloy such as a 0.5% Cu alloy of Al. The standard PVD process is performed in the absence of a high-density plasma and with relatively low ionization of the sputtered particles. However, the sputter deposition is performed quickly and with relatively inexpensive equipment.

The aluminum is preferably deposited in a two-step, cold-hot sputtering process in a traditional sputtering apparatus without a further anneal of the liner layer and without breaking to air between the liner and aluminum depositions. Both steps can easily be performed in a single standard PVD reactor with a significant variation of pedestal heating between the two steps. Of course, separate PVD reactors could be used for the two steps.

In a first Al sputtering step 270, approximately 200 nm of aluminum are sputter deposited over the liner layer 152 with the substrate held at a temperature of 130° C. or lower. This cold sputter forms a seed layer which adheres well to the upper Ti layer 164 without beading. In a second Al sputtering step 272, the bulk of the aluminum is sputter deposited over the cold-deposited layer with the substrate held at a higher temperature. The temperature chosen for the hot-sputter is a tradeoff between lower temperatures and longer reflow times. Detailed data will be presented later, but a hot-sputter temperature of no more than 470° C. is required, and a hot-sputter temperature of as low as 350° C. is shown to provide reasonably short depositions or reflow anneals. An exemplary thickness of the hot-deposited metal layer is 800 nm over the planar surface, which is enough to fill the 1.2 μm-deep plug 140 and substantially planarize the surface thereover, but other thicknesses are possible.

It is noted that in the described three-step PVD deposition of the liner layer, the TiN and TiN$_x$ sublayers are deposited in a process sequence continuously performed at temperatures far below the effective oxidation temperature of TiN relative to the oxygen partial pressure and indeed can be performed at temperatures below 300° C. Furthermore, the environment is maintained substantially free of oxygen through to the end of the aluminum deposition. Hence, the TiN layer has no chance to oxidize and lose its wettability, and even the aluminum is substantially free of oxidation.

PROCESS EXAMPLE 1

A deposition rate of 120 nm/min of partially ionized titanium in a HDP-PVD process was achieved with the following parameters in the aforedescribed chamber for 200 mm wafers. The coil RF source 188 had a frequency of 2 MHz and coupled 1.5 kW of RF power into the inductive coil 186. The DC power source 180 applied 5 kW of DC power to the titanium target cathode 172. The wafer bias source 182 operated at 350 kHz to supply 350 W of power to the pedestal anode 174, resulting in a DC self-bias of 45V on the wafer 176. Chamber pressure was held in range of 20 to 30 mTorr of argon, and the wafer temperature was about 50° C. (siliciding was performed in a separate step). To obtain a Ti deposition rate of 120 nm/min on the planar surface, the pressure was held at 20 mTorr, which corresponds to an argon feed rate of about 45 sccm (standard cubic centimeters per minute, that is, the mass flow rate corresponding to the volumetric flow rate in cc that would occur if the gas were at a pressure of 760 Torr and a temperature of 0° C.).

PROCESS EXAMPLE 2

A deposition rate of 30 nm/min of reactively sputtered TiN using ionized Ti was obtained for the 200 mm wafer in the same chamber and with the RF sources of the same frequencies under the following conditions. The coil 186 was impressed with 1.5 kW of RF power, the target anode 172 with 5 kW of DC power, and the pedestal anode 174 with 90 W of RF power, resulting in a DC self-bias of 70V on the wafer 176. The same pressure range was usable, and the same 50° C. substrate temperature resulted. To obtain a TiN deposition rate of 30 nm/min on the planar surface, the pressure was held at 30 mTorr, which resulted from an argon feed rate of 45 sccm and a nitrogen feed rate of 70 sccm.

LINER PROCESS WINDOW

A series of experiments were performed which varied the chamber pressure and power levels from the electrical sources 180, 182, 188 in order to determine better process parameters that would enhance the coating of a plug hole having a high aspect ratio, in particular a plug having a diameter of 0.35 μm and an aspect ratio of 3.5:1. The plug hole was formed in a silica layer having a thickness of about 1.2 μm; however, the silica layer used in the experiments was formed by thermal oxidation of the underlying silicon, rather than by PECVD deposition of $SiO_2$ over a substrate of either silicon, metal, or possibly some other material, as is now commercially practiced. The process would need to be separately optimized for PECVD-$SiO_2$, but the results are expected to be close to those for thermal $SiO_2$.

Figure 13:
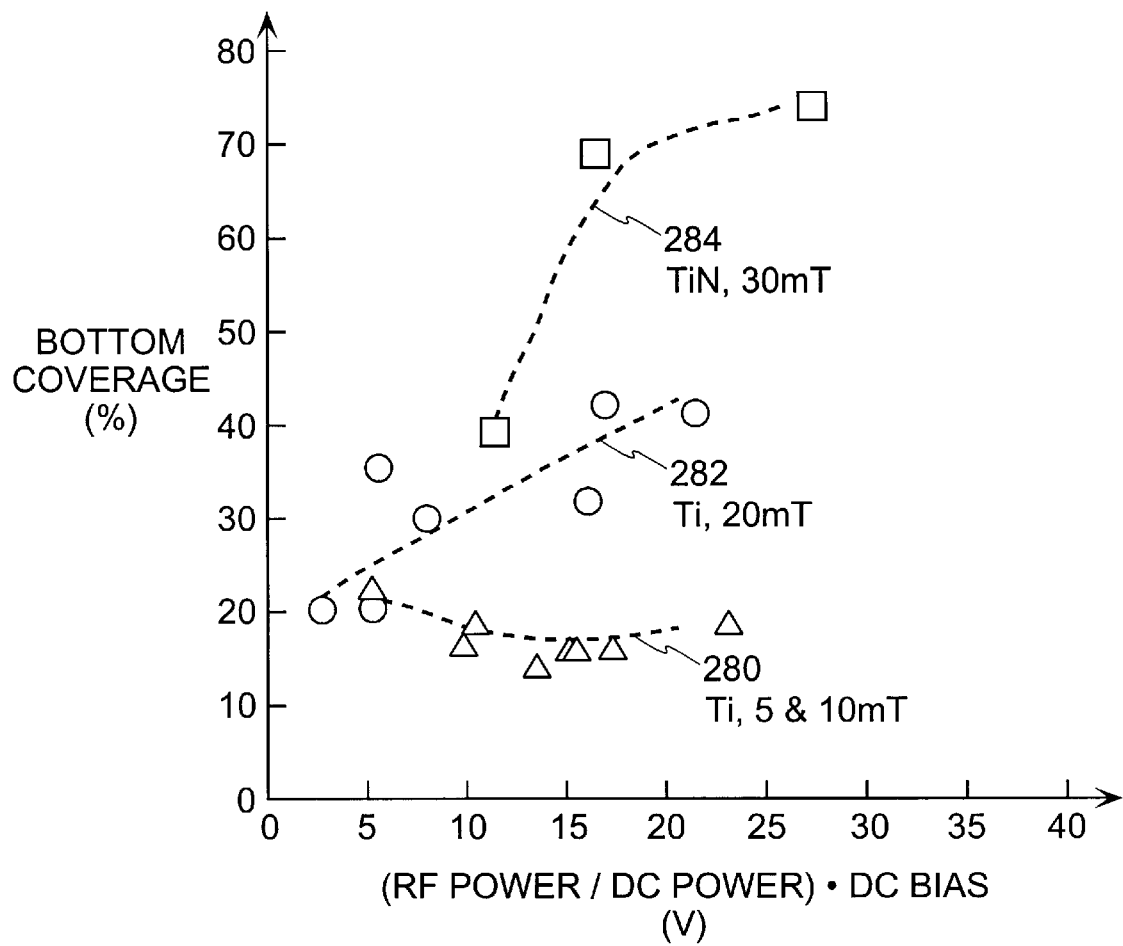
FIG. 13 is a graph showing the process window for deposition of the liner layer as a function of the power levels and pressures.

The data is displayed in the graph of FIG. 13. The abscissa has been normalized for a power parameter equal to the ratio of RF power supplied to the coil 186 divided by the DC power delivered to the target cathode 172 multiplied by the DC self-bias developed on the pedestal anode 176. Along the ordinate is plotted the percentage bottom coverage, that is, the ratio of the thickness of the deposited layer at the bottom portions of the plug hole to the thickness on the planar surface surrounding the top of the plug hole. For quickly forming a liner layer extending throughout the plug hole, a high bottom coverage ratio is desired.

In one set of experiments, the powers were varied for the HDP-PVD deposition of Ti in an argon pressure of 5 to 10 mTorr. The data is represented by triangles, generally following trace 280. These data show no particular trend except that the bottom coverage is low.

In a second set of experiments, the argon pressure was raised to 20 mTorr. The variation of bottom coverage with normalized power is shown by the circles, generally following trace 282. The bottom coverage generally increases with the normalized power, with normalized power parameters of 10 to 15V being interpreted as possible thresholds for commercial use.

In a third set of experiments, TiN was reactively sputtered. The chamber pressure was held at 30 mTorr with the argon and nitrogen feeds being kept at the previously described values of 10 sccm and 70 sccm respectively. The data are represented by squares generally following trace 284. Although a sharp knee exists in this trace 284 at a normalized power of 15V, above which the bottom coverage shows very high values, acceptable values nonetheless occur at normalized powers of 10V and above.

Even apart from the effective bottom filling at high values of RF power delivered to the coil, which increases the density of the plasma, increased bottom coverage is accompanied by increased smoothness of the deposited liner layer, which enables the aluminum to flow with unexpected ease, that is, at lower temperatures, over the walls of the plug hole to more readily rapidly fill it without the formation of voids. The smoothness of the liner layer is believed to result from the ionized particles impinging upon the partially formed surface with an energy in neighborhood of 10 ev so as to clean and equilibrate the surface. It thus believed that the liner layer of the invention also provides increased resistance to electromigration in the interconnects.

UPPER AND LOWER TITANIUM LAYERS

A principal purpose for the lower titanium layer in the liner layer, when contact is being made to silicon, is to provide a source material for siliciding the underlying silicon to form a good ohmic contact. If, on the other hand, the contact is being made to a metal, for example, through a via in an upper-layer dielectric which connects two levels of wiring, the titanium layer is not necessary. Likewise, the graded upper $TiN_x$ sublayer is predominantly required to clean the sputter target of nitrogen in preparation for the titanium deposition of the next wafer. Thus, the graded $TiN_x$ is not needed for bottom contact to a metal if hole filling can be promoted by the TiN sublayer alone. It is believed possible that for some material and structural combinations involving inter-metal contacts and for some planar structures, the liner layer need have only the TiN sublayer grown according to the invention to provide a smooth surface for the subsequent deposition of aluminum.

COHERENT VS. HDP TiN

An experiment was performed showing the advantage of HDP TiN as the principal part of the liner layer versus coherent (collimated) TiN, both of which offer similar plug coating properties. The coherent TiN was reactively sputtered in a chamber designed to fill 2:1 contact holes. The coherent TiN film was deposited over a period of 300 s with 12 kW of DC power applied to the target cathode. The substrate had a thermal oxide coating and was held at 300° C. The HDP TiN film was reactively sputtered in an HDP-PVD chamber with 5 kW of DC power applied to the target and 1.5 kW of RF power applied to the coil, and 90 W of RF power was applied to the pedestal resulting in −70V of DC self bias. The pedestal was held at 25° C.

After the TiN depositions (there was no graded $TiN_x$ layer), the wafers were transferred to a standard aluminum sputtering chamber, which deposited 300 nm of aluminum alloyed 0.5% with copper using 10 kW of DC power over 36 s with a pedestal temperature of 300° C. There was a two-hour air break for the coherently deposited wafer, but no air break for the HDP-deposited sample.

Visual inspection showed the aluminum deposited over HDP-TiN had a shinier appearance than that deposited over coherent TiN. Transmission electron micrographs showed the aluminum grains grown over the HDP-TiN were about three times larger than those grown over the coherent TiN. X-ray diffraction of the sample with the HDP-TiN showed within the range of 30 to 60° a single peak at about 38.7°, corresponding to the Al <111 >orientation, with a signal-to-noise ratio of about 70:1. On the other hand, the X-ray diffraction of the sample with coherent TiN showed the same 38.7° peak with a signal-to-noise ratio of about 20:1 with a smaller peak at 36.8° having a peak height of about 15% of the main peak. This secondary peak was not apparent in the sample underlaid with HDP-TiN.

Figure 14:
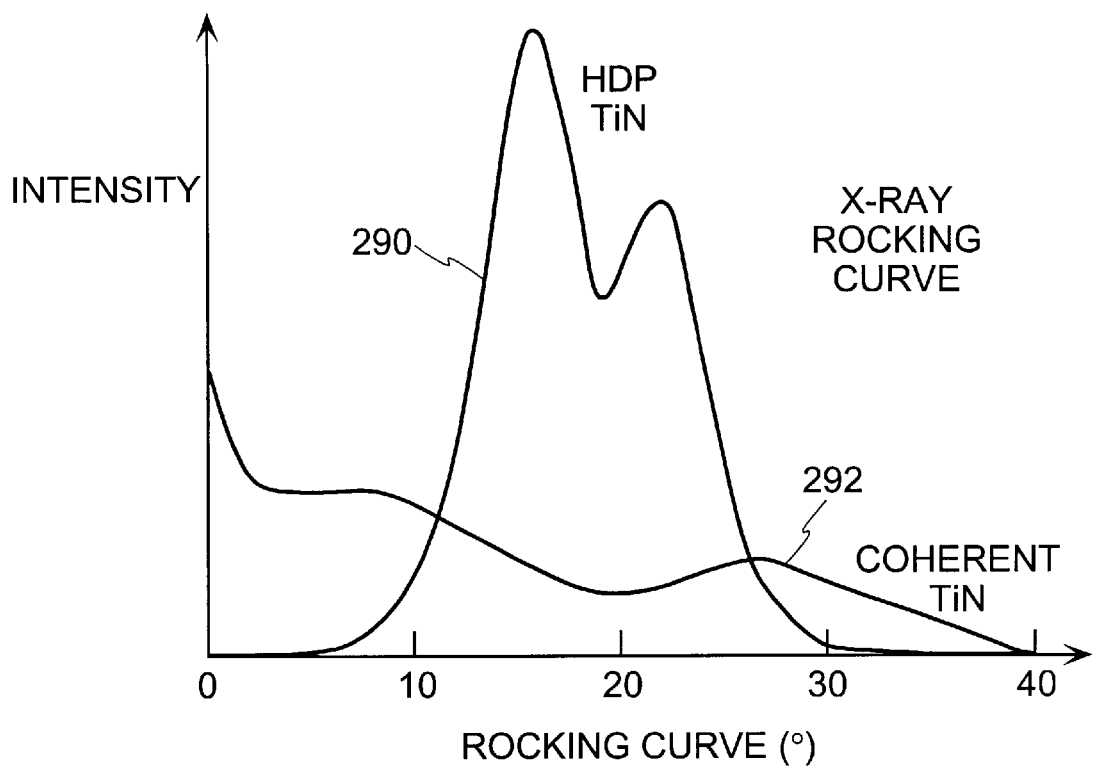
FIG. 14 is a graph showing X-ray rocking curves demonstrating the crystallinity of the aluminum layer deposited on the TiN layer formed according to the invention.

X-ray rocking curves are presented in the graph of FIG. 14. Rocking curve 290 is for the Al <111> peak with the sample including a HDP TiN layer, and rocking curve 292 is for the same peak with the sample including a coherent TiN layer. These rocking curves show the aluminum grown over coherent TiN is has substantially random crystallographic orientation while that grown over HDP TiN is tightly oriented with the <111> orientation normal to the plane.

The data show that the aluminum deposited on HDP TiN manifests a larger grain structure and a more directed grain orientation than the aluminum deposited on colllimated TiN. As discussed above, uniformly large TiN crystallites and an increased crystallographic orientation reduces electromigration.

UPPER TITANIUM PROCESS WINDOW

The TiN layer, especially as manifested in its dense and smooth crystal structure when grown by HDP-PVD, appears to drive the fundamental characteristics of the after deposited aluminum. However, any titanium intervening between the TiN and the Al has important effects. Nearly pure titanium is obtained in the upper portions of the graded $TiN_x$ layer, but similar effects could be obtained if a special titanium sputter process were performed without any nitrogen being included.

Titanium provides known wetting and bonding functions for aluminum deposited over it. Hence, a significant amount of titanium seems desirable, although the need to include it in nearly pure form ($TiN_x$, $x \approx 0$) at the upper surface has hitherto not been clearly demonstrated. On the other hand, an excessive thickness of titanium would seem to reduce the effectiveness of the crystal structure of the TiN layer in promoting the reflow properties of aluminum deposited over titanium. For plug filling applications, too thick a layer of titanium has been observed to produce overhangs of $TiAl_3$ potentially shadowing the plug hole. It is noted that the X-ray data presented above were measured on a planar sample without a Ti or $TiN_x$ layer but only with the HDP TiN layer. However, the absence of plugs means that reflow was not required.

A series of experiments were performed with variations of the thickness of the $TiN_x$ graded layer and, in some case, of the hot deposition temperature and the plug aspect ratio.

Typical process parameters for the experiments are as follow. The plugs were formed in thermal silicon oxide and had aspect ratios in range of 2:1 to 4:1. The structures had a lower Ti layer of 20 nm thickness, a TiN layer of 600 nm thickness, and a $TiN_x$ graded layer of 10 nm thickness. The so formed liner layer was then sputter coated in a conventional PVD apparatus with 200 nm of cold aluminum and 800 nm of hot aluminum.

From the SEMs, it is obvious that, at a heater temperature of 450° C. for the hot aluminum deposition, the fill properties are better for the thin, 10 nm-thick graded layer. It is believed that the thicker, 60 nm graded layer reacts with the aluminum deposited over it to form $TiAl_3$, whose rough grain structure inhibits the flow of aluminum into the plug. At a higher temperature of 535° C., the thicker $TiN_x$ graded layer performs marginally better because it tends to inhibit the de-wetting of the seed layer (cold deposited aluminum). Since the invention is primarily motivated by lower aluminum deposition and reflow temperatures, the better performance of a thicker graded layer at 535° C. is of secondary importance.

Another set of experiments compared reflow at 450° C. on top of a 10 nm-thick $TiN_x$ graded layer with reflow not utilizing a $TiN_x$ layer, that is, no topmost Ti wetting layer. The SEMs showed that reflow was markedly improved with the 10 nm of $TiN_x$.

The final conclusion is that an upper titanium wetting layer is required for narrow plug filling though probably not for planar deposition, and, at least in the processing parameter space presented above, its thickness should be less than 60 nm. The quoted thicknesses are for the $TiN_x$ graded layer since most of it is substantially pure Ti. The lower limit of the Ti thickness probably depends closely on the aspect ratio and other process parameters. For at least the processing parameters of the exemplary data, the thickness needs to be equal to or greater than 10 nm, and the 10 nm thickness is preferred for the processing parameters used.

ALUMINUM PROCESS WINDOW

The substantially conformal deposition of the liner layer in the plug hole through the dielectric leaves the plug hole with an even higher aspect ratio than before. Even though the liner layer promotes plug filling by the after deposited metal, the deposition parameters for the metallization are important if the plug is to be filled without voids in a reasonable length of time and, for many applications, at as low a temperature as is practical. As mentioned previously, a preferred metallization involves a two-step, cold-hot sputtering process. Cold-hot sputtering processes of themselves are well known. Ong in the previously cited patent suggests a cold deposition at 50° to 150° C. and a hot step at 550° C. Wang, in U.S. Pat. No. 5,108,570, suggests a cold deposition at 50 to 250° C. and a hot deposition temperature not to exceed 400° C. Wang does not give good data for the minimum temperature of the hot deposition, and there is no suggestion that it can be much lower than 400° C. However, we have found that the liner layer allows the hot sputter to be performed at a substantially lower temperature, especially if reasonably short PVD deposition times are required.

Another series of experiments were performed for the aluminum deposition by standard PVD into plug holes having high aspect ratios. For these experiments, the dielectric layer was a thermal oxide, that is, silicon was held at high temperature in an oxygen environment to have its surface oxidized into silicon dioxide. In contrast, commercial fabrication is usually done with an oxide deposited by plasma-enhanced CVD or a spin-on glass that is subsequently hardened. Each of these materials would require its separate set of experiments to determine its aluminum process window.

Figure 15:
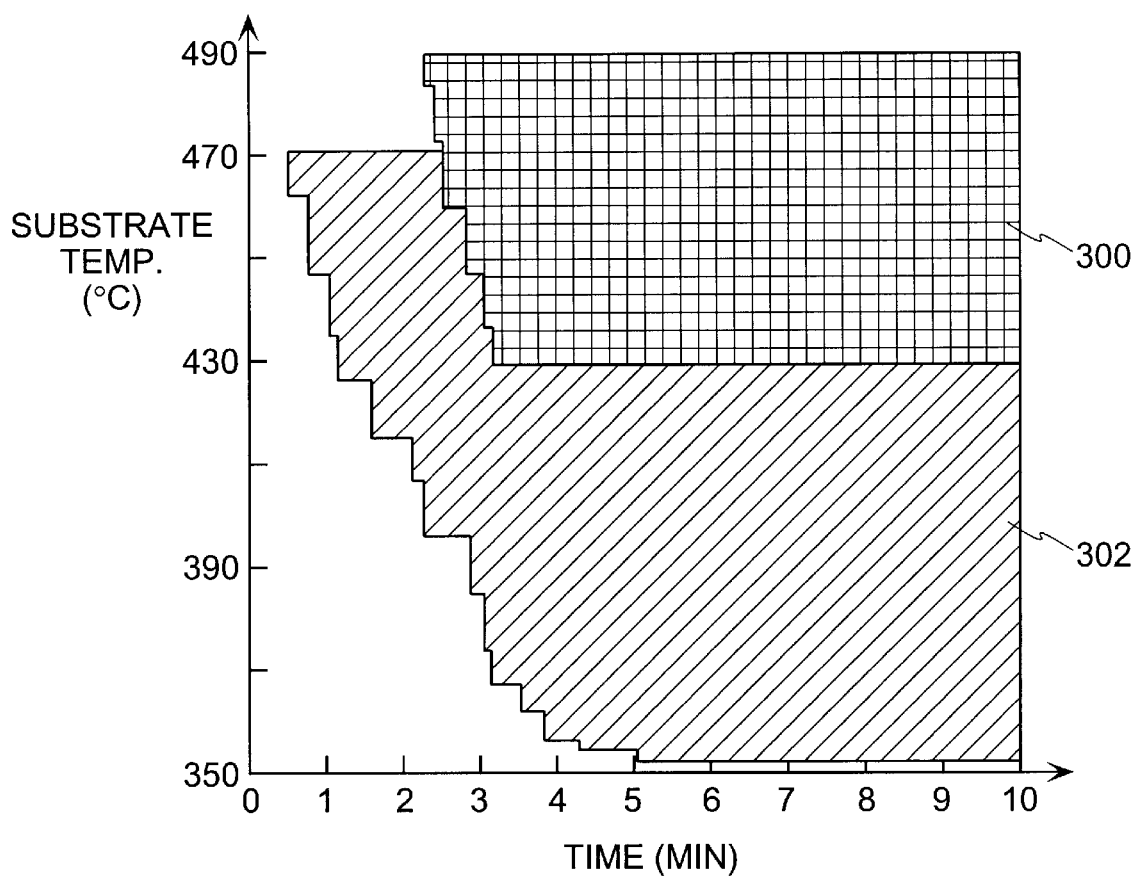
FIG. 15 is graph showing the process window for the standard PVD deposition of aluminum into the plug having the inventive liner layer.

The checked area 300 of FIG. 15 represents the process window for which the prior-art process of filling a high aspect-ratio plug could be applied. Specifically, the TiN liner layer was deposited by collimated PVD, and the aluminum was deposited thereover in a cold-hot PVD process. The ordinate represents the substrate temperature during the hot portion of the sputter deposition of aluminum, and the abscissa represents the time for which the substrate needed to maintained at this higher temperature during the deposition or during a subsequent independent reflow process in order to effectively fill the plug. As is shown, at 430° C. and below, the reflow period must be maintained for more than 3½ minutes, which is considered excessive for high-throughput PVD.

In contrast, the diagonally striped area 302 represents the inventive process in which the aluminum is filled into a plug hole pre-coated with the liner layer and also with the low-temperature Al seed layer. The data are based on a cold deposition of 200 nm of aluminum followed by a hot deposition of 800 nm of aluminum into a hole having a diameter of 0.25 μm and an aspect ratio of 5. The sputtering occurred in a standard PVD chamber with argon pressure in the range of 0.5 to 2 mTorr. The DC target power was adjusted to deposit the 800 nm of hot aluminum in the given time, and the target-to-wafer distances were maintained between the cold and hot depositions. The data may vary somewhat for different geometries of the hole, thicknesses of the metal layers, and other process parameters. It is preferred to perform the cold deposition at 200° C. or below since the dewetting temperature is about 250° C. Again, the plotted temperature is the substrate temperature during the hot deposition, and the time is that during the hot deposition.

It is seen that the inventive process is useful at both lower temperatures and for shorter deposition and reflow times. In particular, very short deposition times are obtained at 470° C., even at 430° C. For hot depositions at 390° C. or even 350° C., the reflow time is still less than four minutes. At approximately 350° C., the reflow period is still a manageable six minutes. The preferred range of temperature for hot deposition is 350 to 400° C., but substrate temperatures of as low as 320 or 300° C. are envisioned for process windows optimized for lower temperatures.

These data show the advantage of an initial aluminum layer deposited at relatively cool temperatures. Such a layer, when deposited on the liner layer of the invention, is smooth and thus promotes reflow. Thereafter, a hot aluminum deposition causes the aluminum to flow without disturbing the interface between the cold aluminum layer and the liner layer. Hence, the aluminum does not dewet and ball up, even at relatively high temperatures.

INTER-LEVEL VIAS

The description above pertains mostly to filling contacts to underlying silicon. For vias between two metal layers, the problems of degrading the underlying silicon are not present. Accordingly, the necessity of the lower titanium layer is not clear. Nonetheless, many aspects of the invention are equally applicable to vias.

Figure 16:
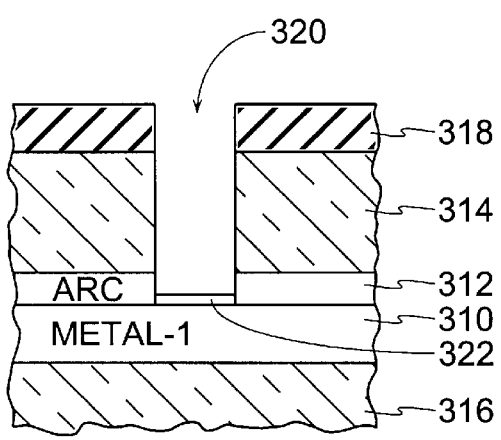
FIG. 16 is a cross-sectional illustration of a via hole.

A typical via structure is illustrated in cross section in FIG. 16 prior to its being filled. A patterned intermediate metal layer 310 (here called the metal-1 layer) of, for example, aluminum is overlaid with an anti-reflection (ARC) coating 312 of TiN that is useful during the photolithographic patterning in preventing excessive reflection from the metal layer 310. Thereover is deposited an inter-level dielectric layer 314 of, for example, $SiO_2$. Although the metal layer 310 is illustrated to be of uniform thickness, it is understood that it is prepatterned into a wiring level including many linearly extending interconnects so that in many areas the dielectric layer 314 directly contacts a lower-level dielectric layer 316. However, a via would be formed over a remaining portion of the metal layer 310. Over the upper-level dielectric layer 314 is deposited a photoresist layer 318, which is developed to expose a via area 320. The inter-level dielectric layer 314 is etched away in the via area 320, gand the photoresist layer 318 is thereafter stripped. Sometimes the TiN ARC layer 312 is also etched through with the dielectric etch although other times it is left to be removed by the plasma preclean. In either case, a thin $Al_2O_3$ layer 322 and other debris resulting from the stripping of the photoresist layer 318 typically form at the bottom of the via hole 320. Although some believe that the removal of this insulating $Al_2O_3$ layer 322 requires no additional steps beyond a preclean that removes the debris, the removal of this stable insulating $Al_2O_3$ layer 322 by plasma preclean is problematic. To assure good contact at the bottom of the via 318, a Ti layer can be deposited. The titanium strongly reacts with the underlying aluminum to form conductive $TiAl_3$ and to thereby break through the intervening layer 320 of insulating $Al_2O_3$. Therefore, the lower Ti sublayer 160 of the liner layer 150, although not needed for siliciding to the lower-level metal layer 310, is still preferred in some situations to assure a good contact to the underying metal layer.

Figure 17:
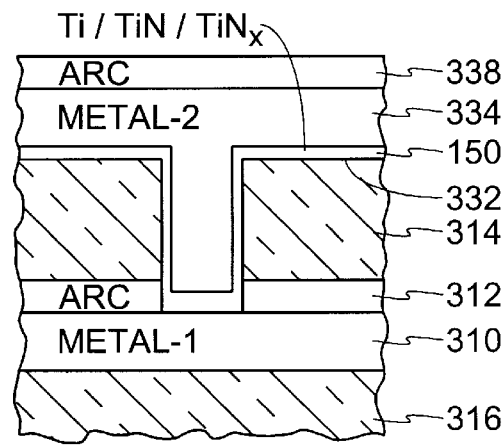
FIG. 17 is a cross-sectional illustration of a via hole after its metallization according to the invention.
Figure 18:
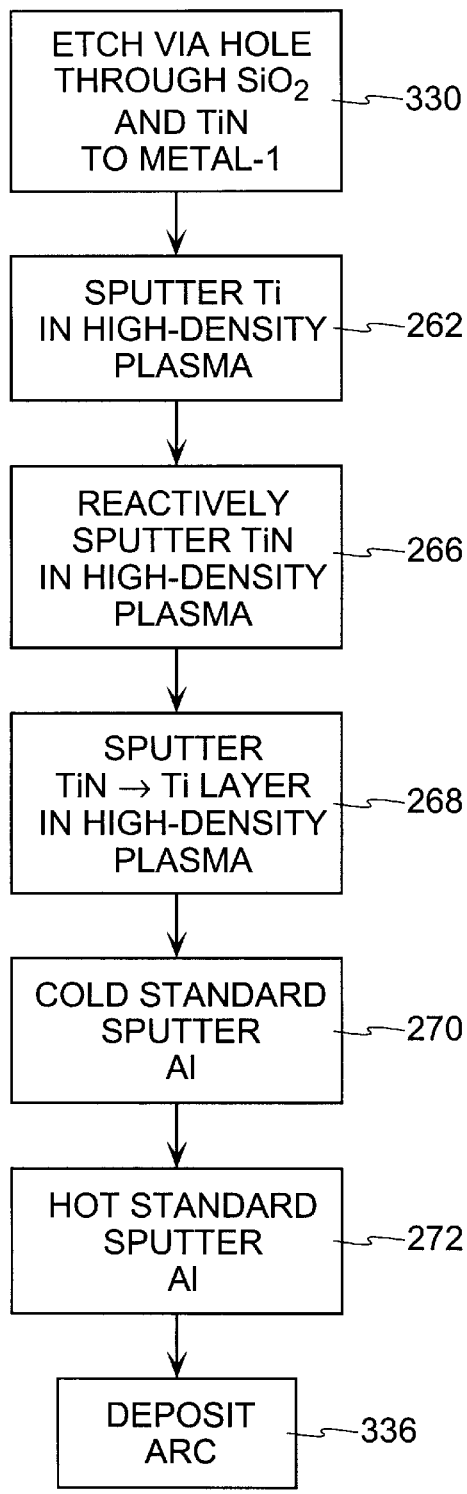
FIG. 18 is a flow diagram of the principal steps in filling a via according to the invention.

Accordingly, a preferred filled via structure is illustrated in cross section in FIG. 17, and the principal steps of its formation are illustrated in the flow diagram of FIG. 18. In step 330, the via hole 320 of FIG. 16 is etched through the upper dielectric layer 314 and through the ARC layer 322. This step may include the plasma preclean. With inter-level vias, it is preferred to facet the upper corners of the via hole 320 by an etching and pre-cleaning process, as described by Ong, ibid. Such facetting is not used with contacts, because the energetic plasma particles are likely to damage the exposed silicon.

In steps 262, 266, 268, a HDP-PVD process is used to deposit the liner layer 150, just as was done for the contact 140 of FIG. 8. The liner layer 152 coats the inside of the via hole 320 and a top surface 332 of the dielectric layer 314. The liner layer 150 contains the three sublayers 160, 162, 164 of Ti, TiN, and $TiN_x$. The HDP-PVD process assures a smooth, dense, and crystallographically aligned liner layer 150.

No separate siliciding is performed for vias because the 400° C. deposition temperature of the aluminum is enough to alloy it with underlying titanium to form $TiAl_3$. In steps 270, 272, a warm, upper metal layer (metal-2) 334 is deposited into the via 320 and above the dielectric layer 314, just as was done for the contact 140 of FIG. 8. The two-step process includes an initial cold standard PVD process and a subsequent hot standard PVD process. In step 336, an ARC layer 338 is deposited over the upper metal layer 334 to facilitate its photolithographic delineation into interconnects.

Although in some situations a lowermost HDP TN layer may provide the necessary electrical contacting since it does not need to be stuffed with oxygen to enable its barrier qualities and titanium is not required for siliciding, the tri-layer embodiment of the liner layer provides the advantage of a smooth liner layer of highly oriented crystallites. Further, the TiN liner layer prevents any moisture entrapped in the silica layer 314 from migrating into the aluminum 334 filled into the via 320. Although the above data indicates the need for a minimum thickness of the upper Ti sublayer in the liner layer, if a process window is used in which the upper Ti sublayer is not needed for reflow, the nitrogen-cleaning function of the upper Ti sublayer is not needed for inter-level vias and thus may also be dispensed with.

The invention thus provides an effective but economical method of sputter filling narrow apertures with metal. The technical data presented above leads to many inferences defined in the following claims, which are not limited by the particular examples presented.

The examples have been principally concerned with nearly symmetrical contacts and vias, but the invention is not so limited. The same concepts can be applied to a contact or via trench in which the trench width determines the aspect ratio.

Figure 19:
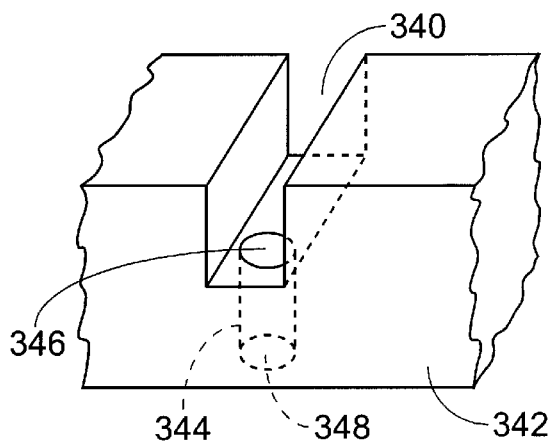
FIG. 19 is an orthographic view of a dual-damascene structure prior to its filling.

A promising structure, illustrated orthographically in FIG. 19, referred to as dual damascene, combines a plug with an interconnect. A dual lithographic process forms both a trench 340 extending laterally along the top of a dielectric layer 342 and a plug 344 extending from an upper opening 346 at the bottom of the trench 340 to a bottom opening 348 at the bottom of the dielectric layer 342 adjacent to an unillustrated silicon substrate or lower interconnect level. A single step of the filling process of the invention can be used to fill metal into both the plug 344 and the trench 340. The metal in the trench 340 is used as an interconnect while that in the plug 344 is used for a vertical inter-layer connection. Such a structure allows the high-density formation of interconnects. Also, no metal lithography is required, only planarization, such as by chemical mechanical polishing of the upper surface so as to expose the unpatterned portions of the dielectric layer 342. However, the dual-damascene structure presents a very high aspect ratio for filling since both the trench and underlying plug need to be simultaneously filled. The invention is directed to filling such narrow and deep holes.

The invention can also be applied to other apertured structures, such as a trench for a DRAM extending only part way through the dielectric layer. Many of the concepts of the invention can be applied to planar structures that do not depend critically upon narrow apertures.

INTERCONNECTS

The previous discussion of both contact and via filling has emphasized that plug filling of the invention is integratable with the deposition of the metal layer for interconnections above the filled plug. Indeed, the X-ray diffraction data discussed with reference to FIG. 14 demonstrate that a metal interconnect, particularly of aluminum, formed over the liner layer of the invention should show superior electromigration behavior because of the large uniform grain size and high crystallographic orientation of the metal crystallites. However, in some applications that do not require narrow plug filling, not all three sublayers of the liner layer are required. It is noted that the X-ray diffraction data was measured for a sample with the aluminum deposited directly over a TiN layer. Also, the lower Ti sublayer is most evidently important for filling of small conductive plugs.

Figure 20:
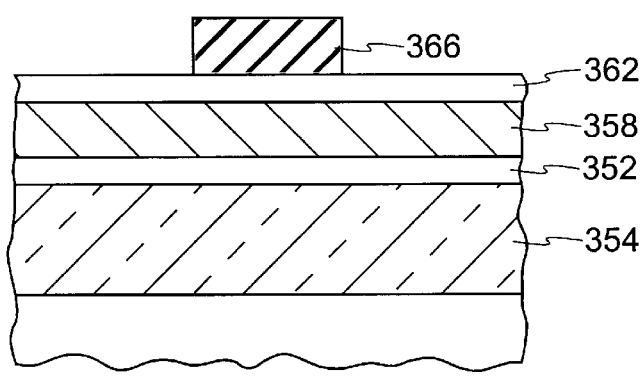
FIGS. 20 and 21 are cross-sectional views of an interconnect formed according to the invention.
Figure 21:
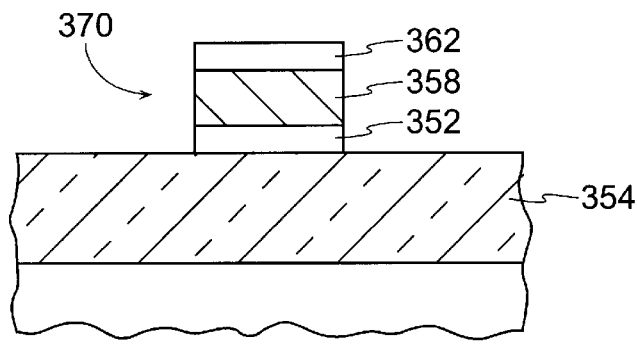
Figure 22:
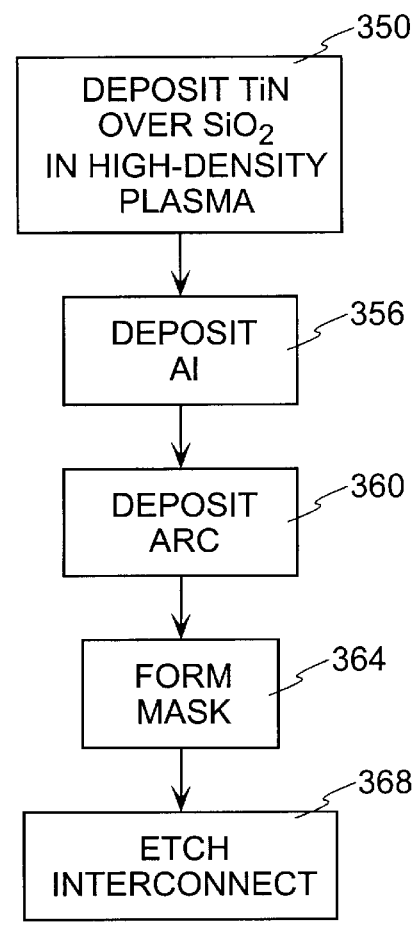
FIG. 22 is a flow diagram of the principal steps in forming an interconnect according to the invention.

Accordingly, an interconnect structure of the invention is shown in cross-section in FIGS. 20 and 21, and its most important fabrication steps are illustrated in the flow diagram of FIG. 22. In step 350, an HDP-PVD process is used to deposit a liner layer 352 on a dielectric layer 354, for example, of $SiO_2$. The liner layer 352 includes at least a TiN sublayer, similar to the TiN sublayer 162 of the contact 140 of FIG. 8. Its formation by HDP-PVD results in its having a smooth surface, large crystallites, and a highly oriented crystallography, as was demonstrated by the X-ray diffraction experiment. The liner layer 352 may additionally include a lower Ti sublayer beneath the TiN sublayer or an upper $TiN_x$ sublayer over the TiN sublayer or both, but their inclusion is not known to be required for interconnects.

In step 356, a metal layer 358, for example, of aluminum is deposited over the liner layer 352. Unlike for hole filling, this planar deposition is non-critical so it can be performed in a single-temperature step by standard PVD if desired. In step 360, an anti-reflection coating 362 is deposited over the metal layer 358, and in step 364 a photolithographic mask 366 of a photoresist material is deposited and patterned over the intended interconnect. Referring now to FIG. 21, the structure is etched around the mask 366 in step 368 to leave the interconnect 370, which because of its formation on the liner layer 352 has uniformly large grains with a tightly oriented <111> crystal structure.

ALTERNATIVES

Although the presently most important application of the invention is filling plug holes and forming interconnects with aluminum, the invention is not so limited. The aluminum may be alloyed, for example, up to 10 wt. % by other metals. Examples of such alloys are alumium-copper, aluminum-copper-silicon, aluminum-silicon, aluminum-germanium, and aluminum-palladium-silicon. Other metals such as Cu and their alloys and suicides have been considered for contacts and interconnects, are subject to the same limitations as Al contacts and interconnects, and thus can enjoy similar benefits of the invention.

Although the dielectric layer of the examples have been silicon dioxide, the invention is not so limited. Other inorganic dielectrics, such as $Si_3N_4$, are presently commonly used as field dielectrics, and other insulating materials including organics can be used for the dielectric layer with the invention being advantageously applied thereto.

The Ti layers of the described examples were used for both wetting and siliciding. Other refractory metals such as Co can also be used for these functions and thus are included within the invention. Several groups are investigating CoSi as an ohmic contact material. The refractory metal can be an intermetallic alloy comprising nearly stoichiometric amounts of two refractory metals.

The TiN preferably used with the invention is a metallic compound with good conductivity and having a highly smooth surface. The TiN layer provides several beneficial results, but other conductive refractory nitride compounds can be substituted therefor, such as TaN, especially if Cu is used as the interconnect metal. Refractory metals other than Ti and Ta that can be used in their elemental and nitride forms are W and Ni.

The invention thus provides a method of effectively filling holes having high aspect ratios and for depositing a metal layer of superior crystallographic quality. The process of filling a narrow hole with metal can be concurrently performed with the deposition of a metal layer that can be defined into interconnects that are resistant to electrornigration. Nonetheless, the process can be performed on less costly equipment while still exhibiting high overall deposition rates, thus achieving high throughput at reduced cost.

What is claimed is:

1. A method of sputtering a metal into a hole formed in a dielectric layer formed on a substrate and having an aspect ratio of at least 2:1, comprising the steps of:
    a first step of sputter depositing onto said substrate a first layer comprising a compound of a refractory metal in a high-density plasma, a high-density plasma being defined as a plasma having an average ionization density of greater than $10^{11} cm^{-3}$ throughout a region said plasma fills; and
    a second step of sputter depositing over said first layer a second, metallic layer performed with a plasma having a density substantially smaller than said high-density plasma of said first step.

2. The method of claim 1, wherein said second layer forms an element electrically conducting along a major axis thereof.

3. The method of claim 1, wherein said first step is performed within a first reaction chamber in which said high-density plasma is principally energized by an inductive coil wrapped around a space of said high-density plasma.

4. The method of claim 3, wherein said second step is performed in a plasma reaction chamber principally energized by voltage applied between a sputtering target comprising at least a portion of said metal and a pedestal supporting said substrate.

5. The method of claim 1, wherein said compound of a refractory metal comprises a nitride of a refractory metal.

6. The method of claim 5, wherein said compound of said refractory metal comprises TiN.

7. The method of claim 5, wherein said compound of said refractory metal comprises TaN.

8. The method of claim 7, wherein said first layer is not exposed to a high-temperature, oxygen-containing environment during said first step or between said first and second steps.

9. The method of claim 1, further comprising a third step, performed between said first and second steps, of sputter depositing, a third layer onto said first layer in a high-density plasma, at least a portion of said third layer facing said second layer consisting essentially of at least one refractory metal.

10. The method of claim 9, wherein said at least one refractory metal comprises Ti.

11. The method of claim 9, wherein said at least one refractory metal comprises Ta.

12. The method of claim 9, wherein said substrate comprises silicon and further comprising a fourth step of sputter depositing over said substrate a fourth layer consisting essentially of at least one second refractory metal.

13. The method of claim 12, wherein said at least one second refractory metal comprises Ti.

14. The method of claim 12, wherein said at least one second refractory metal comprises Ta.

15. The method of claim 1, wherein said first step is performed in a plasma reaction chamber including an inductive coil wrapped around said chamber and powered by a first RF electrical source and a DC electrical source is connected between a sputtering target comprising titanium and a pedestal supporting said substrate.

16. The method of claim 1, wherein said first sputtering step is performed in a chamber that includes said high-density plasma and which has a pressure of greater than 1 mTorr.

17. The method of claim 16, wherein said pressure is above 10 mTorr.

18. The method of claim 17, wherein said pressure is above 30 mTorr.

19. The method of claim 18, wherein said pressure is less than 100 mTorr.

20. The method of claim 16, wherein said pressure is less than 100 mTorr.

21. The method of claim 1,
wherein said substrate includes an oxide layer with a hole extending downwardly from an upper surface thereof,
wherein said first layer is coated onto sides of said hole, and
wherein said second layer fills said hole.

22. The method of claim 1, wherein said compound of said refractory metal comprises tantalum nitride.

23. The method of claim 22, wherein said second, metallic layer comprises copper.

24. The method of claim 22, wherein said first layer is not exposed to a high-temperature, oxygen-containing environment during said first step or between said first and second steps.

25. A method of sputtering a metal in a hole having an aspect ratio of at least 2:1 formed in a dielectric in a substrate, comprising the steps of:
a first step of sputter depositing onto said substrate a first layer comprising a compound of a refractory metal in a high-density plasma, a high-density plasma being defined as a plasma having an average ionization density of greater than $10^{11} \text{cm}^{-3}$ throughout a region said plasma fills; and
a second step of sputter depositing over said first layer a second, metallic layer, wherein said second depositing step comprises:
a first substep of sputter depositing a first sublayer while said substrate is held at a first temperature; and
a second substep of sputter depositing a second sublayer while said substrate is held at a second temperature of less than 400° C. and higher than said first temperature.

26. The method of claim 25, wherein said second, metallic layer comprises aluminum and wherein said first temperature is less than 250° C. and said second temperature is in a range between 350 and 400° C.

27. The method of claim 25, wherein said second, metallic layer comprises aluminum and said second temperature is in a range of 350 to 390° C.

28. A method of sputtering a metal onto a substrate, comprising the steps of:
a first step of sputter depositing onto said substrate a first layer comprising a compound of a refractory metal in a high-density plasma, a high-density plasma being defined as a plasma having an average ionization density of greater than $10^{11} \text{cm}^{-3}$ throughout a region said plasma fills,
wherein said first step is performed in a plasma reaction chamber including an inductive coil wrapped around said chamber and powered by a first RF electrical source and a DC electrical source is connected between a sputtering target comprising titanium and a pedestal supporting said substrate, and
wherein during a generation of said high-density plasma said RF electrical source provides an RF power $P_{RF}$ to said coil and said DC electrical source provides a DC power $P_{DC}$ to said target, and $P_{RF}$ is equal to or greater than 20% of $P_{DC}$; and
a second step of sputter depositing over said first layer a second, metallic layer.

29. The method of claim 28, wherein said plasma reaction chamber further includes a second RF electrical source providing an RF bias to said pedestal to thereby create a DC self bias $V_{BIAS}$ in said high-density plasma and wherein during said generation of said high-density plasma, the following condition is satisfied:

$$\frac{P_{RF}}{P_{DC}} \cdot V_{BIAS} > 10.$$

30. The method of claim 29, wherein:

$$\frac{P_{RF}}{P_{DC}} \cdot V_{BIAS} \geq 15.$$

31. A method of sputtering a metal layer, comprising the steps of:
placing a substrate into a first sputtering chamber including an inductive coil for forming a plasma therein;
a first step including a first substep of depositing onto said substrate within said first sputtering chamber a first layer comprising a compound of at least one refractory metal, said first depositing step utilizing said plasma formed by said inductive coil;
transferring said substrate from said first sputtering chamber to a second sputtering chamber wherein a plasma is generated principally by at least two electrodes associated therewith; and
depositing a second layer comprising a metal onto said first layer utilizing said plasma generated by said at least two electrodes.

32. The method of claim 31, wherein said compound comprises a nitride of said refractory metal.

33. The method of claim 32, wherein said compound comprises tantalum nitride.

34. The method of claim 31, wherein said at least one refractory metal comprises Ti.

35. The method of claim 31, wherein said first step includes a second substep performed before said first substep of depositing a second sublayer consisting essentially of at least one second refractory metal.

36. The method of claim 35, wherein said at least one second refractory metal comprises Ti.

37. The method of claim 31,
wherein said substrate includes an oxide layer with a hole extending downwardly from an upper surface thereof, wherein said first layer is coated onto sides of said hole, and wherein said second layer fills said hole.

38. The method of claim 31, wherein said inductive coil forms a high-density plasma in said first substep, a high-density plasma being defined as a plasma having an average ionization density of greater than $10^{11} \text{cm}^{-3}$ throughout a region said plasma fills.

39. The method of claim 31, wherein said at least one refractory metal comprises Ta.

40. The method of claim 39, wherein said first layer is not exposed to a high-temperature, oxygen-containing environment during said first step or between said first step and the step of depositing said second layer.

41. A method for sputter filling a contact hole having an aspect ratio of at least 2:1 and formed in a dielectric layer formed over a substrate including a silicon portion adjacent a bottom portion of said contact hole, comprising the steps of:

a first step performed in a high-density plasma in a first sputtering chamber of sputter depositing over said substrate including said contact hole a first layer comprising metallic titanium, a high-density plasma being defined as a plasma having an average ionization density of greater than $10^{11} \text{cm}^{-3}$ throughout a region said plasma fills;

a second step performed in a high-density plasma in said first sputtering chamber of sputter depositing over said first layer a second layer comprising TiN;

a third step performed in said first sputtering chamber of sputter depositing over said second layer a third layer having an upper portion comprising metallic titanium; and a fourth step performed in a second sputtering chamber of sputter depositing over said third layer a fourth layer principally comprising aluminum, wherein said fourth step is performed in a plasma principally generated by a DC electrical signal applied between a sputter target comprising aluminum and a pedestal supporting said substrate.

42. The method of claim 41, wherein said second step includes:

supplying gaseous nitrogen into a sputtering chamber enclosing said substrate and a surface of a sputtering target comprising titanium; and sputtering said sputtering target in the presence of said nitrogen, whereby TiN is reactively sputtered onto said substrate.

43. The method of claim 42, wherein said third step includes interrupting the supplying of said nitrogen into said chamber while continuing a plasma between said second and third steps, whereby said third layer is deposited with a composition $TiN_x$ graded between TiN and Ti.

44. The method of claim 41, wherein said second step is performed in a chamber including said high-density plasma which is maintained at a pressure in a range of between 1 to less than 100 mTorr.

45. The method of claim 44, wherein said pressure is equal to or greater than 30 mTorr.

46. A method of forming an interconnect over a dielectric layer having no holes therethrough with aspect ratios of greater than 2:1, comprising the steps of:

depositing in a high-density plasma a liner layer comprising a compound of a refractory metal over an dielectric layer, a high-density plasma being defined as a plasma having an average ionization density of greater than $10^{11} \text{cm}^{-3}$ throughout a region said plasma fills;

sputter depositing a metal layer over said liner layer in a plasma having a smaller plasma density than that of said high-density plasma; and photolithographically defining said metal layer into a horizontally extending electrical interconnect.

47. The method of claim 46, wherein said compound of a refractory metal comprises Ti and N.

48. The method of claim 47, wherein said metal layer comprises aluminum.

49. The method of claim 46, wherein said compound of said refractory metal comprises Ta and N.

50. The method of claim 49, wherein said liner layer is not exposed to a high-temperature, oxygen-containing environment during the step of depositing the liner layer and between the steps of depositing said liner layer and depositing said metal layer.

51. The method of claim 49, wherein said metal layer comprises copper.

52. The method of claim 46, wherein said compound of said refractory metal comprises tantalum nitride.

53. The method of claim 52, wherein said metal layer comprises copper.

54. The method of claim 46, wherein said dielectric layer has no holes therethrough with aspect ratios of, greater than 0.5:1.

55. A method of sputtering a metal into a hole formed in a dielectric layer formed on a substrate and having an aspect ratio of at least 2:1, comprising the steps of:

a first step of sputter depositing onto said substrate a first layer comprising a compound of a refractory metal in a high-density plasma, a high-density plasma being defined as a plasma having an average ionization density of greater than $10^{11} \text{cm}^{-3}$ throughout a region said plasma fills; and a second step of sputter depositing over said first layer a second, metallic layer performed with a plasma having a density substantially smaller than said high-density plasma of said first step;

wherein said substrate includes an oxide layer with a hole extending downwardly from an upper surface thereof, wherein said first layer is coated onto sides of said hole, wherein said second layer fills said hole, wherein said second depositing step comprises:

a first substep of sputter depositing a first sublayer while said substrate is held at a first temperature; and a second substep of sputter depositing a second sublayer while said substrate is held at a second temperature higher than said first temperature and wherein said metal layer comprises aluminum and wherein said second temperature is less than 400° C.

56. A method of sputtering a metal into a hole formed in a dielectric layer formed on a substrate and having an aspect ratio of at least 2:1, comprising the steps of:

a first step of sputter depositing onto said substrate a first layer comprising a compound of a refractory metal in a high-density plasma a high-density plasma, being defined as a plasma having an average ionization density of greater than $10^{11} \text{cm}^{-3}$ throughout a region said plasma fills; and a second step of sputter depositing over said first layer a second, metallic layer performed with a plasma having a density substantially smaller than said high-density plasma of said first step, wherein said substrate includes an oxide layer with a hole extending downwardly from an upper surface thereof, wherein said first layer is coated onto sides of said hole,
wherein said second layer fills said hole,
wherein said second depositing step comprises:
- a first substep of sputter depositing a first sublayer while said substrate is held at a first temperature; and
- a second substep of sputter depositing a second sublayer while said substrate is held at a second temperature higher than said first temperature, and wherein said metal layer comprises aluminum and wherein said second temperature is in a range of 300 to less than 400° C.

57. The method of claim 56, wherein said range of said second temperature extends from 350 to 390° C.

58. A method of sputtering copper onto a substrate, comprising the steps of:
- a first step of sputter depositing onto said substrate a first layer comprising tantalum and nitrogen in a high-density plasma, a high-density plasma being defined as a plasma having an average ionization density of greater than $10^{11} \text{cm}^{-3}$ through a region said plasma fills; and
- a second step of sputter depositing over said first layer a copper layer performed with a plasma having a density substantially smaller than said high-density plasma of said first step.

59. A method for sputter filling a contact hole formed in a dielectric layer formed over a substrate including a silicon portion adjacent a bottom portion of said contact hole, comprising the steps of:
- a first step performed in a high-density plasma of sputter depositing over said substrate including said contact hole a first layer comprising metallic tantalum, a high-density plasma being defined as a plasma having an average ionization density of greater than $10^{11} \text{cm}^{-3}$ throughout a region said plasma fills;
- a second step performed in a high-density plasma of sputter depositing over said first layer a second layer comprising tantalum nitride;
- a third step of sputter depositing over said second layer a third layer having an upper portion comprising metallic tantalum; and
- a fourth step of sputter depositing over said third layer a fourth layer principally comprising copper.

* * * * *